(12) United States Patent
Kobayashi et al.

(10) Patent No.: US 7,285,765 B2
(45) Date of Patent: Oct. 23, 2007

(54) PHOTOELECTRIC CONVERTER AND X-RAY IMAGE PICK-UP DEVICE

(75) Inventors: Isao Kobayashi, Kanagawa-Ken (JP); Noriyuki Kaifu, Tokyo (JP); Shinichi Takeda, Kanagawa-Ken (JP); Kazuaki Tashiro, Kanagawa-Ken (JP); Tadao Endo, Kanagawa-Ken (JP); Toshio Kameshima, Kanagawa-Ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/622,971

(22) Filed: Jan. 12, 2007

(65) Prior Publication Data

US 2007/0114363 A1   May 24, 2007

Related U.S. Application Data

(62) Division of application No. 10/703,513, filed on Nov. 10, 2003, now Pat. No. 7,170,042, which is a division of application No. 09/853,683, filed on May 14, 2001, now Pat. No. 6,664,527, which is a division of application No. 09/310,122, filed on May 12, 1999, now Pat. No. 6,297,493, which is a division of application No. 08/708,490, filed on Sep. 5, 1996, now Pat. No. 5,914,485.

(30) Foreign Application Priority Data

Sep. 5, 1995 (JP) ................... 7-227851
Sep. 5, 1995 (JP) ................... 7-227852
Sep. 3, 1996 (JP) ................... 8-232872

(51) Int. Cl.
*H01J 40/14* (2006.01)

(52) U.S. Cl. ................ 250/208.1; 250/370.09; 257/444; 358/483

(58) Field of Classification Search ............. 250/208.1, 250/214.1, 214 R, 370.09; 348/302–303; 358/482–483; 257/443–444
See application file for complete search history.

(56) References Cited

U.S. PATENT DOCUMENTS 4,376,888 A   3/1983   Fukuda et al. ........... 250/211 J (Continued)

FOREIGN PATENT DOCUMENTS

EP   0653626   5/1995

(Continued)

OTHER PUBLICATIONS

T. Seto et al.: "Performance of 1M-IRCSD imager with Pti Schottky-barrier detectors", SPIE 2020 Proceedings 1993, D. Shepherd Editors, 1993, pp. 404-414, XPOO2071024 *the whole document.

*Primary Examiner*—Kevin Pyo
(74) *Attorney, Agent, or Firm*—Fitzpatrick, Cella, Harper & Scinto

(57) ABSTRACT

A photoelectric converter includes a plurality of substrates, which are located adjacent to each other and on which a plurality of photoelectric conversion devices are two-dimensionally arranged, and either scan circuits or detection circuits that are arranged on two opposing sides of the photoelectric converter, whereby scanning directions either from the scan circuits or from the detection circuits, which are arranged on the two opposing sides, are capable of being set so as to be performed in like directions.

20 Claims, 16 Drawing Sheets

U.S. PATENT DOCUMENTS

| | | | |
|---|---|---|---|
| 4,931,661 A | 6/1990 | Fukaya et al. | 250/578.1 |
| 5,060,040 A | 10/1991 | Saika et al. | 357/30 |
| 5,233,442 A | 8/1993 | Kawai et al. | 358/482 |
| 5,272,548 A | 12/1993 | Kawai et al. | 358/482 |
| 5,306,648 A | 4/1994 | Fukaya et al. | 437/3 |
| 5,315,101 A | 5/1994 | Hughes et al. | 250/208.1 |
| 5,317,406 A | 5/1994 | Kobayashi et al. | 348/307 |
| 5,335,094 A | 8/1994 | Kaifu et al. | 358/494 |
| 5,338,690 A | 8/1994 | Fukaya et al. | 437/3 |
| 5,379,068 A | 1/1995 | Hamasaki | 348/322 |
| 5,914,485 A | 6/1999 | Kobayashi et al. | 250/208.1 |
| 6,075,256 A | 6/2000 | Kaifu et al. | 257/53 |
| 6,297,493 B1 | 10/2001 | Kobayashi et al. | 250/208.1 |
| 6,664,527 B2 | 12/2003 | Kobayashi et al. | 250/208.1 |
| 7,170,042 B2 * | 1/2007 | Kobayashi et al. | 250/208.1 |
| 2003/0146994 A1 | 8/2003 | Kokubun | 348/308 |
| 2004/0108463 A1 | 6/2004 | Kobayashi et al. | 250/208.1 |

FOREIGN PATENT DOCUMENTS

| | | |
|---|---|---|
| EP | A0660421 | 6/1995 |
| JP | 62-23944 | 5/1987 |
| JP | 1-302972 | 12/1989 |
| JP | 5-300434 | 11/1993 |
| JP | 6-104434 | 4/1994 |
| JP | 6-188400 | 7/1994 |
| JP | 7-94697 | 4/1995 |

* cited by examiner

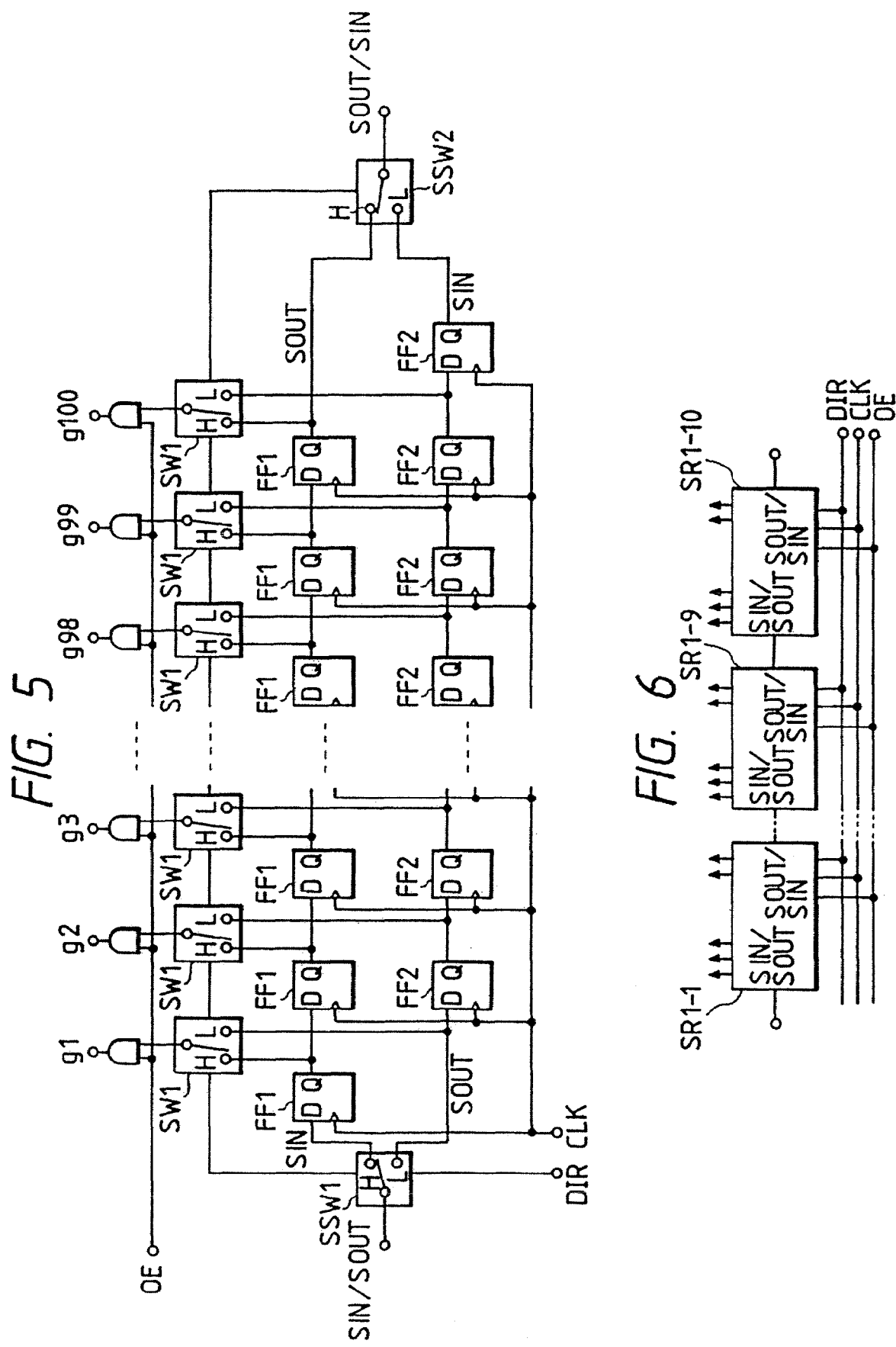

PHOTOELECTRIC CONVERTER AND X-RAY IMAGE PICK-UP DEVICE

RELATED APPLICATIONS

This application is a division of application Ser. No. 10/703,513, filed Nov. 10, 2003 now U.S. Pat No. 7,170, 042, which is a division of application Ser. No. 09/853,683, filed May 14, 2001 (now U.S. Pat. No. 6,664,527 dated Dec. 16, 2003), which is a division of application Ser. No. 09/310,122, filed May 12, 1999 (now U.S. Pat. No. 6,297, 493 dated Oct. 2, 2001) which is a division of application Ser. No. 08/708,490, filed Sep. 5, 1996 (now U.S. Pat. No. 5,914,485 dated Jun. 22, 1999). The related applications are incorporated herein by reference.

BACKGROUND OF THE INVENTION

1. Field of the Invention

The present invention relates to a photoelectric converter, and in particular, to a two-dimensional photoelectric converter that is used for facsimile machines, digital copy machines, and X-ray machines.

2. Related Background Art

Conventionally, a scanning system that employs a reducing optical system and a CCD sensor is used for a scanning apparatus, such as a facsimile machine or a digital copy machine. Recently, however, as a consequence of the development of photoelectric conversion semiconductor material, such as amorphous silicon (hereinafter referred to as a-Si), a so-called close-contact sensor has been developed for which a photoelectric conversion device and a signal processor are formed on a large substrate, and by which data are scanned by using an optical system that has the same magnification rate as that of a data source. Furthermore, since a-Si can be employed not only as a photoelectric conversion material but also as a thin film field-effect transistor film (hereinafter referred to as a TFT), both a photoelectric conversion semiconductor layer and a TFT semiconductor layer can be formed at the same time.

The basic structure of a photoelectric converter that uses a-Si is described in the specification for U.S. Pat. No. 4,376,888, or in Japanese Patent Publication No. 62-23944, or Japanese Patent Publication No. 63-6617.

A specific example for the integral forming of an a-Si photosensor and an a-Si TFT is described in the specifications for U.S. Pat. Nos. 4,931,661, 5,338,690 and 5,306,648.

Based on the techniques disclosed in these specifications, the present inventors produced as a sample photoelectric converter a two-dimensional area type in which the number of pixels was drastically increased. The outline of the photoelectric converter will now be described while referring to FIGS. 1 and 2. This device is disclosed in European Patent Publication No. 0660421.

FIGS. 1 and 2 are plan views of a photoelectric converter that has 2000×2000 pixels. To provide 2000×2000 sensors, the number of photoelectric conversion devices that are included in an arrangement are increased in both the vertical and the horizontal directions. For this converter, 2000 control lines (scan lines) are also required, as is indicated by g1 through g2000, and accordingly, 2000 signal lines (data lines) are required, as is indicated by sig1 through sig2000. In addition, the sizes of a scanning circuit and an integrated circuit used for detection (a detection IC) are increased because they have to control and handle 2000 signal lines. When these processes are performed by single, one-chip ICs, the sizes of the chips must be increased, and the yielding manufacturing ratio and the prices are adversely affected. As is shown in FIGS. 1 and 2, in a scan circuit, therefore, sufficient shift registers to handle 100 stages, for example, are formed on a single chip and 20 of these scan circuit chips (SR1-1 through SR1-20) are used. For the detection process for the integrated circuit, 100 processing circuits are formed-on a single chip, and 20 of these integrated circuit detection chips (IC-1 through IC-20) are used.

In FIG. 1, 20 chips (SR1-1 through SR1-20) are mounted along the left side (L) and another 20 chips (IC-1 through IC-20) are mounted across the down side (D). Connected to each chip by wire bonding are 100 control lines or signal lines. The portion that is enclosed by broken lines in FIG. 1 corresponds to a photoelectric conversion device array that is arranged as a two-dimensional area. The connection of the detection integrated circuit to an external device is not shown.

In another example, shown in FIG. 2, 10 chips (SR1-1 through SR1-10) are mounted along the left side (L) and 10 chips (SR1-11 through SR1-20) are mounted along the right side (R); and 10 chips (IC-1 through IC-10) are mounted across the upper side (U) and 10 chips (IC-11 through IC-20) are mounted across the down side (D). Since in this structure 1000 lines are provided at each of the upper, down, left and right sides (U, D, L and R), the density of the lines arranged along each side is reduced and the concentration of the wire bonding required on each side is also decreased, thus providing an increased manufacturing yielding ratio. Lines g1, g3, g5, . . . , and g1999 are arranged along the left side (L), while g2, g4, g6, . . . , and g2000 are arranged along the right side (R). That is, the odd numbered control lines are distributed along the left side (L), and the even numbered control lines are distributed along the right side (R). With this arrangement, since each line is pulled out so that the liens are located at equal intervals, the lines are not overly concentrated and the yielding ratio is increased. The wiring across the upper side (U) and the down side (D) is performed in the same manner.

Though not shown, in an additional example, lines g1 through g100, g201 through g300, . . . , and g1801 through g1900 are provided on the left side (L), while lines g101 through g200, g301 through g400, . . . , and g1901 through g2000 are provided on the right side (R). In other words, it is possible for contiguous control lines to be distributed to each chip and for these chips to be alternately sorted to the left side and to be right side (to L and to R). With this arrangement, the control lines for a single chip can be controlled sequentially, the adjustment and the setup of drive timing can be facilitated, a circuit does not become complicated, and an inexpensive IC can be used. The same arrangement can be applied for upper and the down sides (U and D), and an inexpensive IC that can perform a continuous process can be used.

Further, if the selection of control lines (scanning) is so designed that it is performed in the order corresponding to the direction indicated by arrow AL1 in FIG. 2, the order in which the output terminals for each of the scan circuits SR1-1 through SR1-10 are arranged on the left side (L) in FIG. 2 is the opposite of the order in which the output terminals for each of the scan circuits SR1-11 through SR1-20 are arranged on the right side (R). When the scan circuits that are arranged on both sides are formed by using IC chips having the same structure, connection lines (lines for connecting control lines to the output terminals of the scan circuits) on either the right side (R) or the left side (L) must be formed of multi-layer lines, etc. As a result, the structure of the connection lines becomes complicated and expensive, and the high-density mounting of scan circuits is prevented.

Two types of ICs are prepared for which the orders in which output terminals are located differ, and ICs of one type are arranged on the left side (L), while ICs of the other type are arranged on the right side (R). However, the manufacture of two types of ICs, even though their basic operations are the same, results in higher manufacturing costs.

The above described shortcomings not only apply to scan circuits, but also apply to detection ICs (IC-1 through IC-20) for the output of read signals in a time series.

SUMMARY OF THE INVENTION

It is a second object of the present invention to provide better throughput to accompany an improved efficiency for an inspection procedure during fabrication of photoelectric converters having large dimensions, and to reduce total manufacturing costs that accompany a reduction in the number of components.

It is a third object of the present invention to provide an enhanced function for a photoelectric converter having large dimensions by scanning all of the photoelectric conversion devices in the same direction, and by simplifying signal processing.

It is a fourth object of the present invention to provide a photoelectric converter wherein one type of IC can be easily mounted on all sides, upper, down, right and left (U, D, R and L), of a photoelectric conversion device array.

To achieve the above objects, according to a first aspect of the present invention, a photoelectric converter comprises:

a plurality of substrates, which are located adjacent to each other and on which a plurality of photoelectric conversion-devices are two-dimensionally arranged;

either scan circuits or detection circuits, at least, that are arranged on two opposing sides of the photoelectric converter, whereby scanning directions either from the scan circuits or from the detection circuits, which are arranged on the two opposing sides, are capable of being set so as to be performed in like directions.

Furthermore, to achieve the above objects according to a second aspect of the present invention, provided is a photoelectric converter wherein four substrates on which a plurality of photoelectric conversion devices are arranged two-dimensionally are so bonded together two-dimensionally, with two each in a vertical direction and in a horizontal direction, that the photoelectric conversion devices are located adjacent to each other on a plane; wherein, from among the four substrates that are bonded together, two substrates that are not adjacent to each other have such a positional relationship that substrates having the same structure are rotated 180° relative to each other on a plane; and wherein the substrates are scanned in the same direction.

According to a third aspect of the present invention, provided is a photoelectric converter wherein a plurality of substrates, on which photoelectric conversion devices are two-dimensionally mounted, are so located and bonded together that the photoelectric conversion devices are located adjacent to each other on a plane; and wherein the plurality of substrates are bonded together at the same locations as those when semiconductor layers are deposited that serve as the photoelectric conversion devices for each of the substrates.

Further, as it is possible to improve the efficiency of an inspection procedure and the throughput that accompanies it, and to reduce the number of required components, and as a result, the cost of manufacturing a photoelectric converter having large dimensions can be reduced.

In addition, since all of the photoelectric conversion devices can be scanned in the same direction and signal processing can be performed at a high speed by a simple device, the cost of manufacturing the photoelectric converter can be reduced, while the function of the photoelectric converter can be improved.

Furthermore, a photoelectric converter wherein the amount of incident light can be detected, as the photoelectric conversion device has only one introduction prevention layer, can be provided at a low price; the optimizing of the process is easy and the yielding ratio can be increased; the manufacturing cost can be reduced; and the SN ratio is high.

The exposure apparatus that employs the above converter differs from conventional X-ray film in that it can project its output very quickly, and in that image processing and data storage are also possible. It has better sensitivity than the film, and a clear image can be obtained with a weak X-ray that will have little adverse effect on a human body.

When the substrates are bonded in consonance with the locations of the substrates when the film is deposited, the characteristics of the photoelectric conversion devices on different substrates that are at the least located at positions adjacent to each other on different substrates can be sequentially equalized.

BRIEF DESCRIPTION OF THE DRAWINGS

FIG. 5 is a diagram illustrating the structure of the scan circuits shown in FIG. 3;

FIG. 6 is a diagram showing an example structure of the scan circuits for a single photoelectric converter in which 10 scan circuit chips SR1-1 through SR1-10 are connected in series;

DETAILED DESCRIPTION OF THE PREFERRED EMBODIMENTS

First Embodiment

Figure 2:
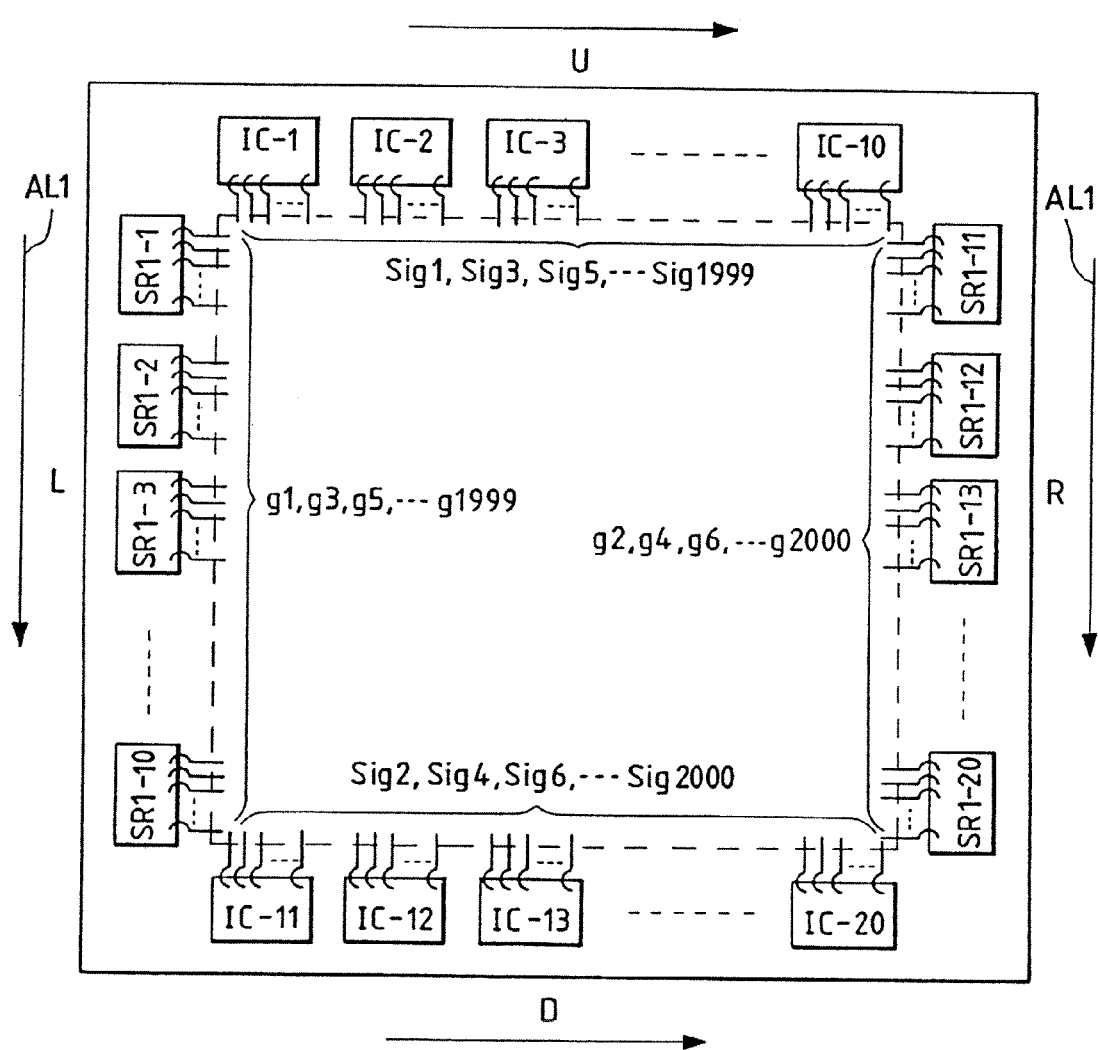
FIG. 2 is a plan view of another conventional photoelectric converter that has 2000×2000 pixels.
Figure 3:
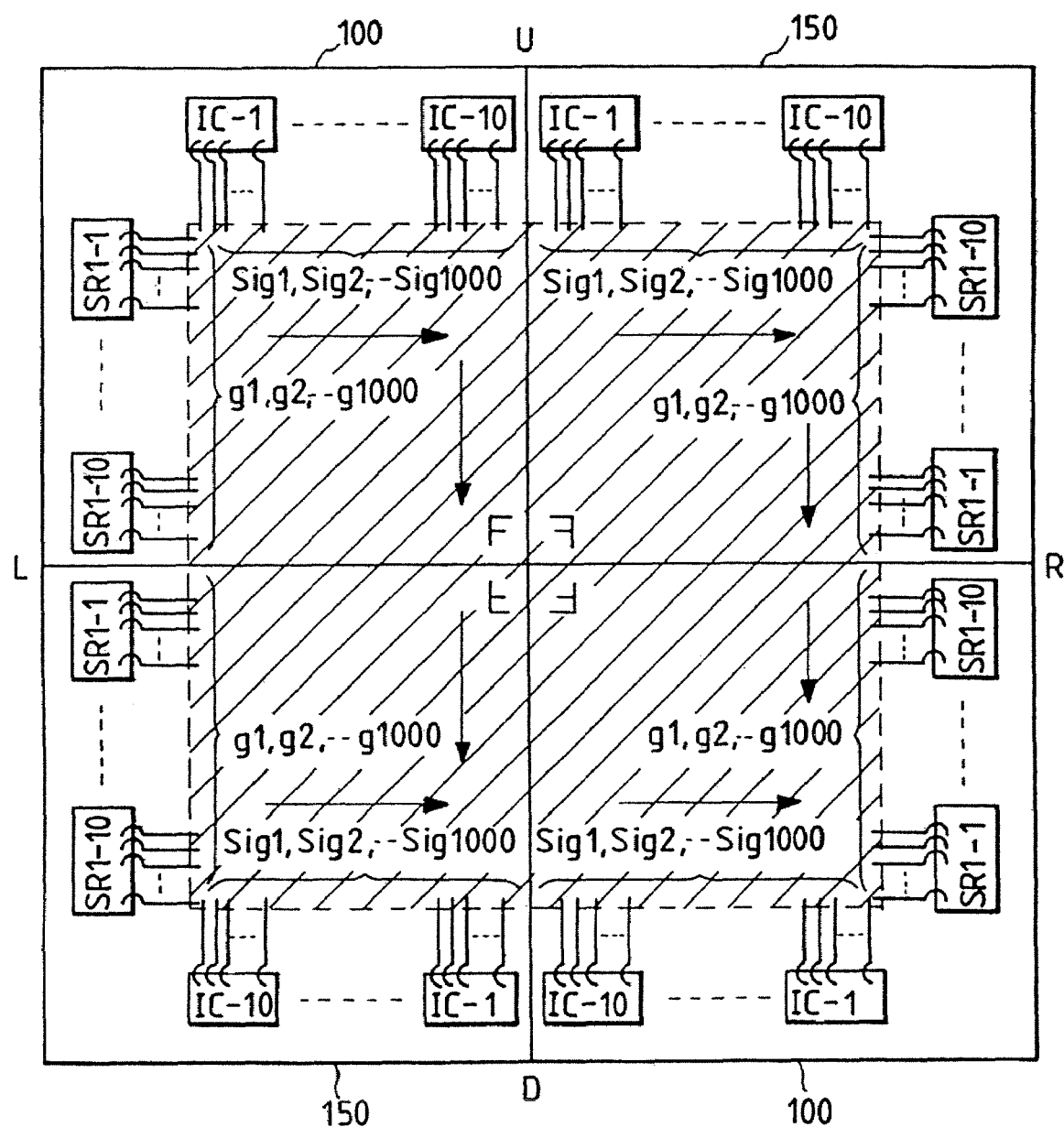
FIG. 3 is a plan view of the overall structure of a photoelectric converter according to a first embodiment of the present invention.

FIG. 3 is a plan view of the overall structure of a photoelectric converter according to a first embodiment of the present invention. The reference numerals are used to denote corresponding or identical components in FIGS. 1 and 2, and no explanation will be given for them.

As the feature of the photoelectric converter shown in FIG. 3, while each pair of four substrates 100, 150, 100 and 150 are located at the positions they occupy after being relatively rotated 180°, and four photoelectric conversion device arrays (shaded portions enclosed by broken lines) are arranged adjacent to each other with substantially no gap between them. With this configuration, the four substrates are bonded together to constitute a single large photoelectric converter.

Two diagonally located substrates have the same structures.

Further, when the scanning direction, indicated by arrows in FIG. 3, for the scan circuits of the photoelectric device arrays on the four substrates and the scanning direction, also indicated by arrows in FIG. 3 for their detection integrated circuits, i.e., the directions for the parallel-serial conversion of detection signals, are set to be bidirectional, the four photoelectric conversion device arrays are scanned in the same direction as when viewed as a whole, which is the feature of the photoelectric converter.

Located on each substrate 100 are 1000×1000 photoelectric devices that are connected to 2000 lines, i.e., 1000 control lines g1 through g1000 and 1000 signal lines sig1 through sig1000. And as there are 100 scan circuits SR1 formed on a single IC chip, there are a total of 10 IC chips SR1 through SR1-10 located on the substrate 100, the individual terminals of each IC chip being connected to the respective control lines g1 through g1000.

As for the detection integrated circuits, 100 processing circuits are formed on a single IC chip, with 10 detection integrated circuit chips, IC-1 through IC-10, being located on each substrate and with the individual terminals of each IC chip being connected to the signal lines sig1 through sig1000. The substrate 150 has the same structured as the substrate 100, and has 1000×1000 photoelectric conversion devices arranged on it that are connected to 1000 control lines and 1000 signal lines. Also provided are 10 of the scan circuits and 10 of the detection integrated circuits. Although for each substrate these scan circuits and the integrated circuits may differ, it is preferable that a single type of IC be used for all the substrates, as will be described later. Thus, the four photoelectric conversion device arrays on the four substrates can be scanned at the same time. In this case, when compared with the example shown in FIG. 2, the period of time required for the scanning can be reduced to ¼ of that required for the example in FIG. 2.

The photoelectric device arrays are fabricated on the four substrates, as is shown in FIG. 3, and the four substrates are bonded together with as a small gap as possible between them, so that a photoelectric converter having large dimensions can be constituted. As a result, the yielding ratio for each substrate can be increased, and the losses that are incurred due to defects on the individual substrates can be reduced.

Figure 1:
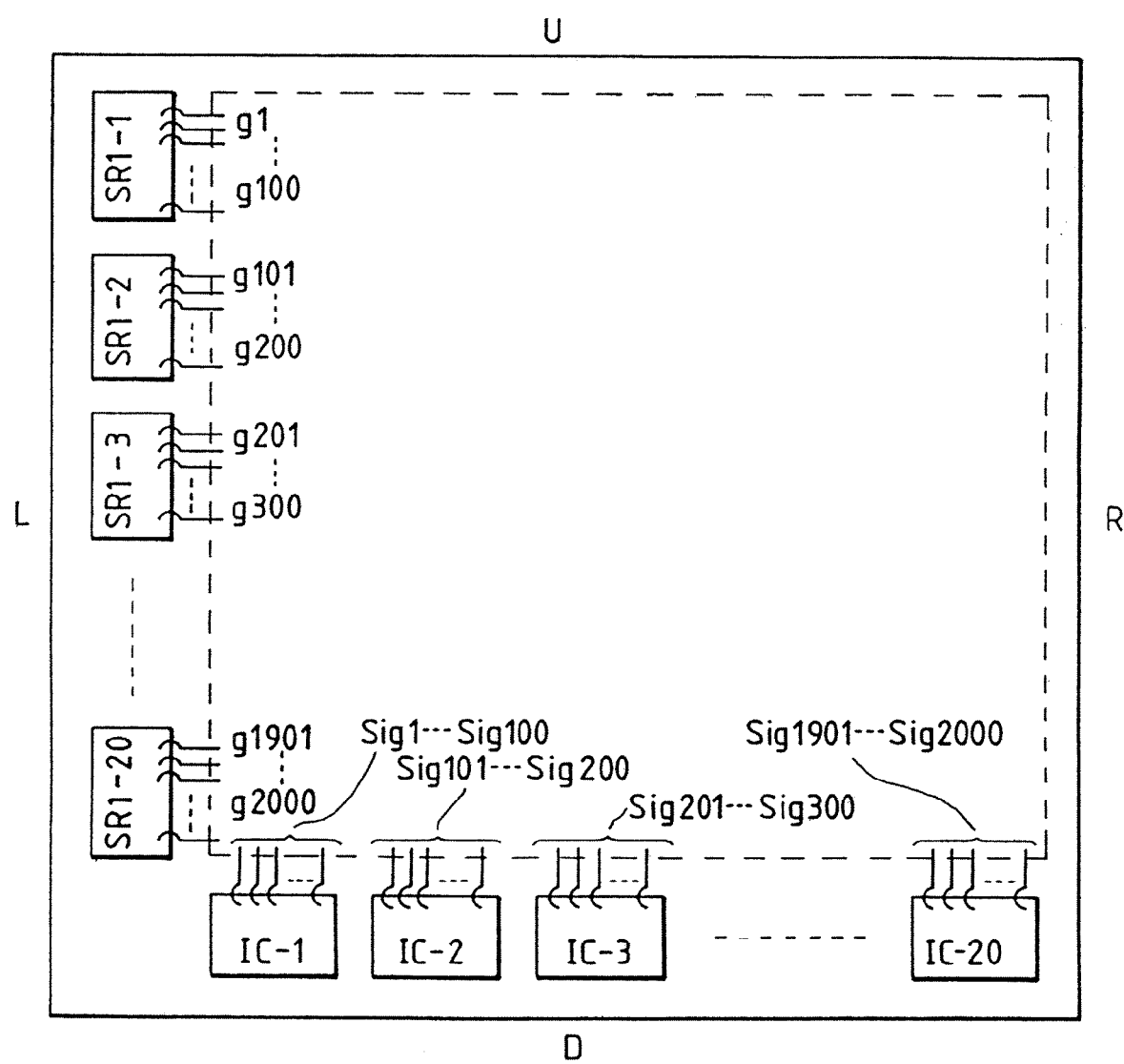
FIG. 1 is a plan view of a conventional photoelectric converter that has 2000×2000 pixels.

Specifically, when the area of the photoelectric converter in FIG. 3 on which photoelectric conversion devices are mounted is the same as the area of the photoelectric converter in FIG. 1 on which photoelectric conversion devices are mounted, the total length of all of the control lines and all of the signal lines for the substrates in FIG. 3 is about ¼ the total length of all the control lines and signal lines for the photoelectric converter in FIG. 1.

In such a photoelectric converter, a short circuit or an open circuit in a control line or in a signal line causes all of the output signals of the photoelectric conversion devices connected to the line to become inaccurate, and the photoelectric converter can not be employed. The possibility of the occurrence of such a defect is substantially proportional to the total length of all the control lines and signal lines, and as a result of such a defect, the yielding ratio will be reduced.

Therefore, a yielding ratio due to a defect in the wiring for each substrate in FIG. 3 is about four times the yielding ratio for the photoelectric converter shown in FIG. 1. The loss that is occasioned when a defect occurs on one substrate shown in FIG. 3 and the photoelectric converter can not be used is proportionate to the dimensions of all the substrates. The loss, therefore, is about ¼ of that experienced as a loss by the photoelectric converter in FIG. 1 when a defect occurs and the converter can not be used.

As is shown in FIG. 3, two of the substrates 100 are formed that have a first pattern photoelectric conversion device array, while two of the substrates 150 are formed that have a second pattern photoelectric conversion device array, and mounted on these four substrates are the same scan circuits and detection integrated circuits. Two of the substrates are rotated 180° and are diagonally positioned, and the four substrates are bonded together to constitute a photoelectric converter having large dimensions. As a result, the number of required components can be reduced. The inspection procedure can be performed by two types of devices, and the efficiency of the inspection procedure and accompanying throughput can be increased. As a result, the cost of manufacturing a photoelectric converter having large dimensions can be reduced.

The scan circuits and the integrated detection circuits, which are mounted on the four substrates, can be driven bidirectionally, and the circuits are employed in the shift direction that is determined by the input of a signal for specifying the shift direction, so that the four substrates arranged in FIG. 3 can be scanned in the same direction. As a result, a simple circuit is required for processing read signals for all of the photoelectric conversion devices, and signals can be processed at a high speed.

Therefore, a photoelectric converter having large dimensions and high performance can be provided at a low manufacturing cost.

Figure 4A:
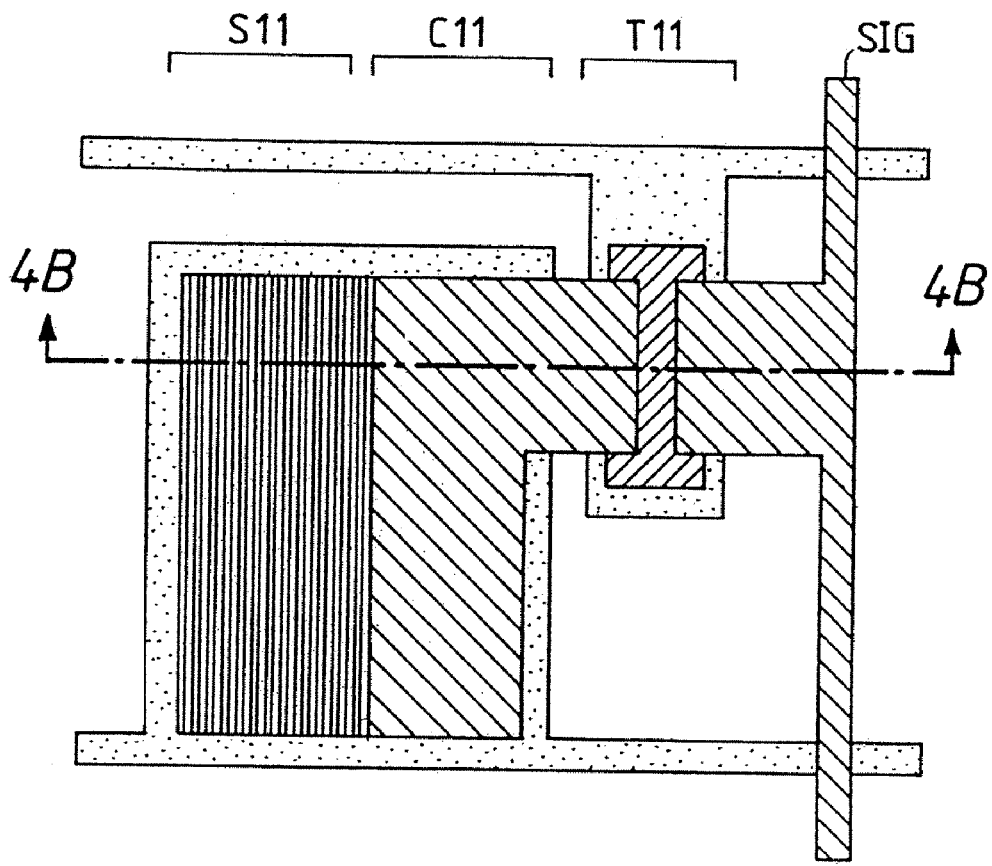
FIG. 4A is a cross sectional view of a photoelectric conversion device according to the first embodiment of the present invention.
Figure 4B:
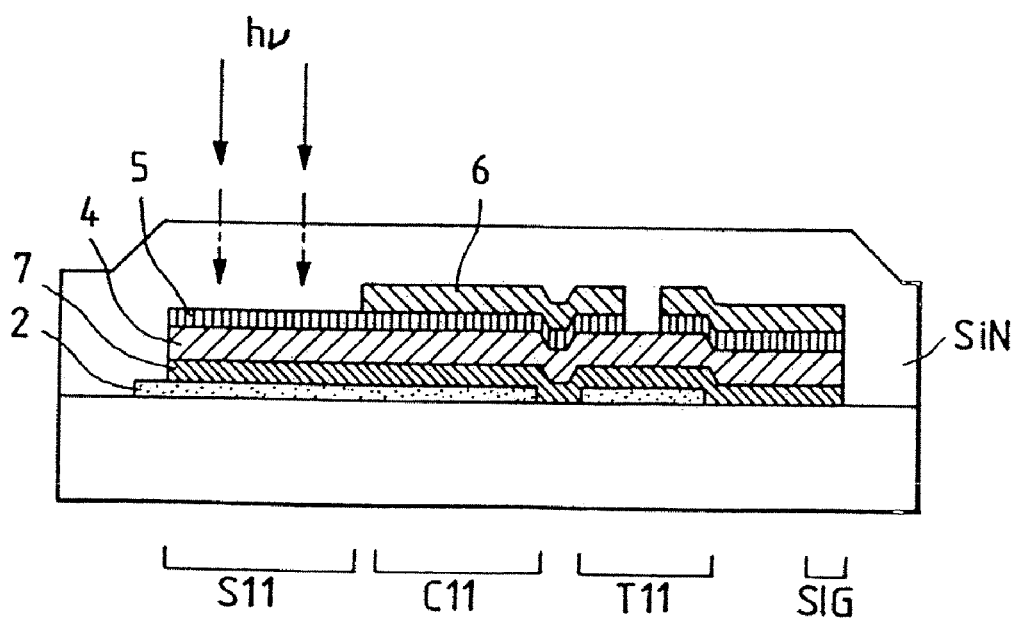
FIG. 4B is a cross sectional view of the scan structure taken along line 4B-4B in FIG. 4A.

As is shown in FIGS. 4A and 4B, provided as the structure on the photoelectric converter are photoelectric conversion devices, each of which is a laminate composed of a first electrode layer 2, an insulating layer 7, a semiconductor layer 4 that can perform photoelectric conversion, a semiconductor layer 5 for preventing introduction of a first conductive carrier, and a second electrode layer 6. The photoelectric converter comprises: photoelectric conversion means for accumulating, on the semiconductor layer 5, the first conductive carrier, which is induced by signal light that enters the semiconductor layer 5, and for providing an electric field to a light receiving device in a direction in which the second conductive carrier, which differs from the first conductive carrier, is to be guided to the second electrode layer 6; refresh means for providing an electric field for the light receiving devices in a direction in which the first conductive carrier is to be guided from the semiconductor layer to the second electrode layer; and a signal detector for detecting the first conductive carrier, which is accumulated on the semiconductor layer, or the second conductive carrier, which is guided to the second electrode layer, during photoelectric conversion performed by the photoelectric conversion means.

In FIGS. 4A, 4B and 5, S11 denotes a light-receiving device; T11, a TFT; C11, a capacitor, and SIG, a signal line. The capacitor C12 and the light-receiving device S11 are not separated from each other, and they can be integrally formed because the light-receiving device, the capacitor and the TFT have substantially the same layer structure. A silicon nitride film SiN is deposited as a passivated film on the upper portion of a pixel. When light enters the photoelectric conversion device from upward, the light is converted into an electric signal (accumulated electric change amount).

The structure of the scan circuit shown in FIG. 3 will now be explained while referring to FIG. 5.

The scan circuit includes AND gates, which are provided in a number that is equivalent to the count of the output lines, select switches SW1, two-stage delay flip-flops (D flip-flops) FF1 and FF2, and select switches SSW1 and SSW2.

When a high level voltage is applied, as a signal for specifying a shift direction, to terminal DIR, the select switches SSW1, SSW2 and SW1 are shifted to high (H). In consonance with a shift pulse, which is input at input/output terminal SIN/SOUT on the left side (L20) in FIG. 5, and a clock, which is input at a clock input terminal, the D flip-flops FF1 sequentially output a series of "1s", indicating which gate lines are selected, to the AND gates via the select switches SW1. When, at this time, an output-enable pulse "1" is input at control terminal OE, the output of the AND gates is "1" and an output terminal is selected. In this manner, the output terminals are selected in the order g1, g2, g3, . . . , g98, g99, and g100.

The operation for performing shift in the opposite direction will now be described. When a low level voltage is applied in the shift direction to control terminal DIR, the select switches SSW2, SW1 and SSW1 are shifted to low (L).

When a shift pulse is input at the input/output terminal SOUT/SIN on the right side (R) in FIG. 5, the D flip-flops FF2 sequentially output a series of "1s" to the AND gates via the select switches SW1. When, at this time, an output enable pulse "1" is input at the control terminal OE, the output of the AND gates is "1" and an output line is selected.

In this manner, the output lines are selected in the order g100, g99, g98, . . . , g3, g2, and g1.

Figure 7:
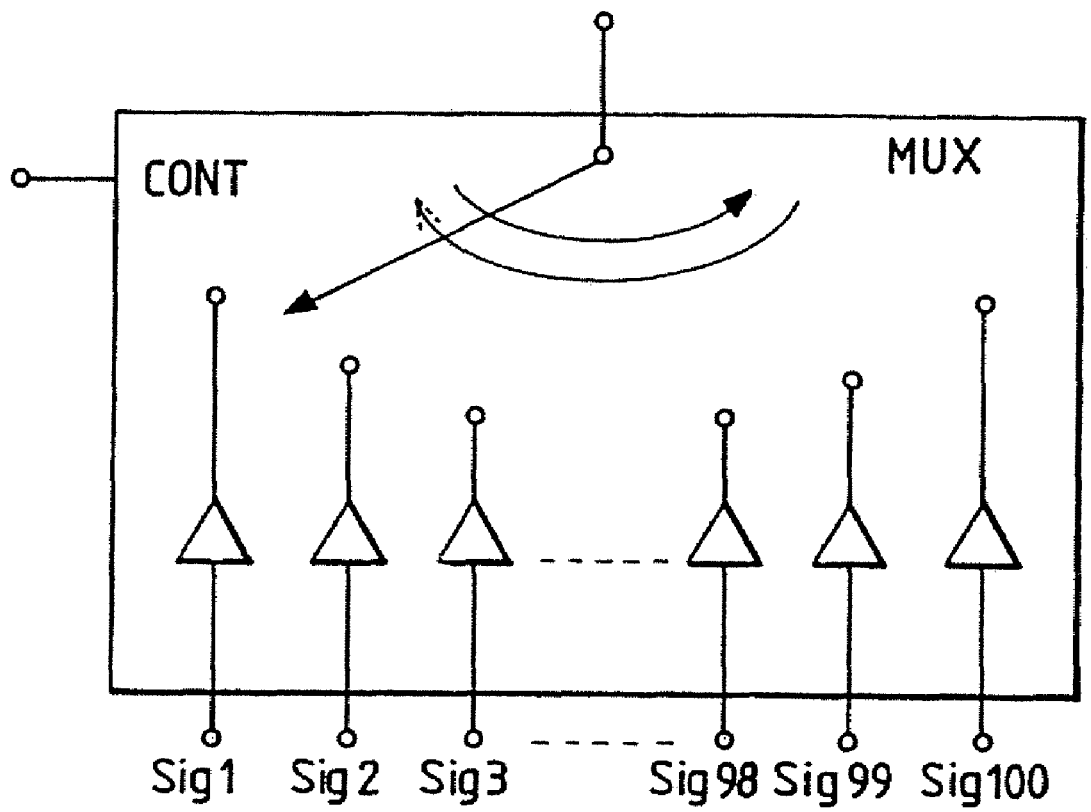
FIG. 7 is a diagram showing the structure of a single integrated circuit detection chip.

FIG. 6 is a diagram showing an example structure, for scan circuits of a single photoelectric converter, in which 10 scan circuit chips SR1-1 through SR1-10 are connected in series. FIG. 7 is a diagram showing the structure of a single integrated circuit detection chip. The IC chip includes a multiplexer, and employs a structure wherein an electric rotary switch for selecting the order for the output of received signals (or the order for the input of signals) is controlled by using a control signal input at a control terminal CONT.

Figure 8:
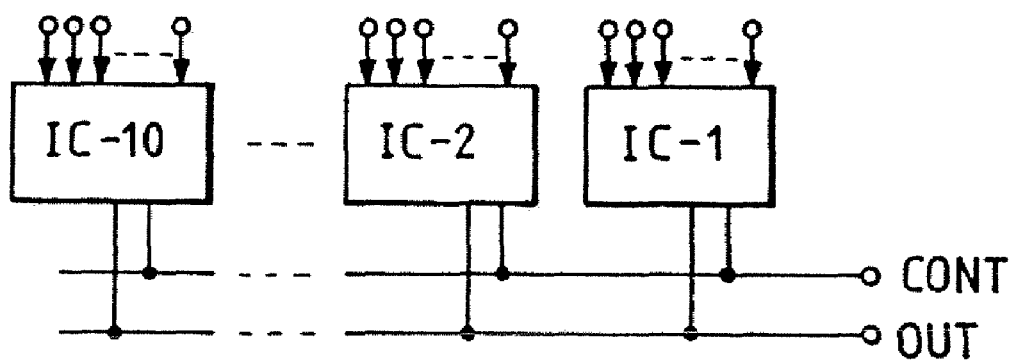
FIG. 8 is a diagram showing an example wherein 10 detection integrated circuit chips IC-1 through IC-10 are connected in series.

FIG. 8 is a diagram showing an example wherein 10 detection integrated circuit chips IC-1 through IC-10 are connected in series.

The operation performed by the converter in FIG. 3, for which the scan circuits and the detection integrated circuits shown in FIGS. 5 through 8 are employed, will now be described.

Depending on whether a chip is mounted on the substrate 100 or on the substrate 150, the order in which the terminals of the chips that are connected to the gate lines or the signal lines of the photoelectric conversion device array are physically located, and the direction in which the chips are shifted are reversed.

The shift directions for the IC chips shown in FIGS. 5 through 8 are selectively determined in consonance with signals input at the control terminals DIR and CONT. IC chips of the same type can be mounted on both of the substrates 100 and 150.

The scan circuits that are mounted on the upper left hand substrate 100 and the lower left hand substrate 150 are so determined that when a high voltage is applied to the terminal DIR the shift direction is toward the control lines g1, g2, . . . , and g100.

On the other hand, the scan circuits that are mounted on the upper right hand substrate 150 and the lower right hand substrate 100 are so determined that when a low voltage is applied to the terminal DIR the shift direction is toward the control lines g100, g99, . . . , and g1.

The scan select signals from the IC chips are output from the upper and lower left hand substrates in the order SR1-1 to SR1-10, while they are output from the upper and lower right hand substrates in the order SR1-10 to SR1-1.

Similarly, a high level pulse is input at the terminal CONT of the detection IC chips that are mounted on the upper right and left hand substrates in FIG. 3, and detection signals are rearranged into a time series and are output from the terminals in the order sig1, sig2, . . . , and sig100.

On the other hand, a low level pulse is input at the terminals CONT of the detection IC chips that are mounted on the lower right and left hand substrates in FIG. 3, and detection signals are rearranged into a time series and are output from the terminals in the order sig100, sig99, . . . , and sig1.

The outputs of the individual chips on the upper right and left hand substrates are performed in a time series in the order IC-1 to IC-10, while the outputs of the chips on the lower right and left hand substrates are performed in a time series in the order IC-10 to IC-1.

There are four methods for mounting IC chips which can be employed for the photoelectric converter of the present invention. They are: a chip-on-glass system (COG method) for mounting chips directly on four substrates using a flip-chip system; a method (a TAB method) for employing a tape carrier package IC with which chips are connected to and mounted on a flexible printed wiring substrate; a wire bonding method for arranging IC chips on four substrates; and a monolithic integration method for fabricating scan circuits and detection circuits on the same substrate by using a thin semiconductor film that constitutes a photoelectric conversion device. When the size of an IC chip is too large to ignore and the size of the external region (external frame) of a photoelectric conversion device array is to be reduced, the use of the TAB method, with which a substrate can be bent, is preferable. According to the TAB method, it is preferable that control lines or signal lines be connected to the terminals of a tape carrier package IC by using an anisotropic conductive adhesive.

The four substrates can be laminated with a mothersubstrate having large dimensions that is made of glass, ceramic, metal or resin, and bonded together.

Second Embodiment

Figure 9:
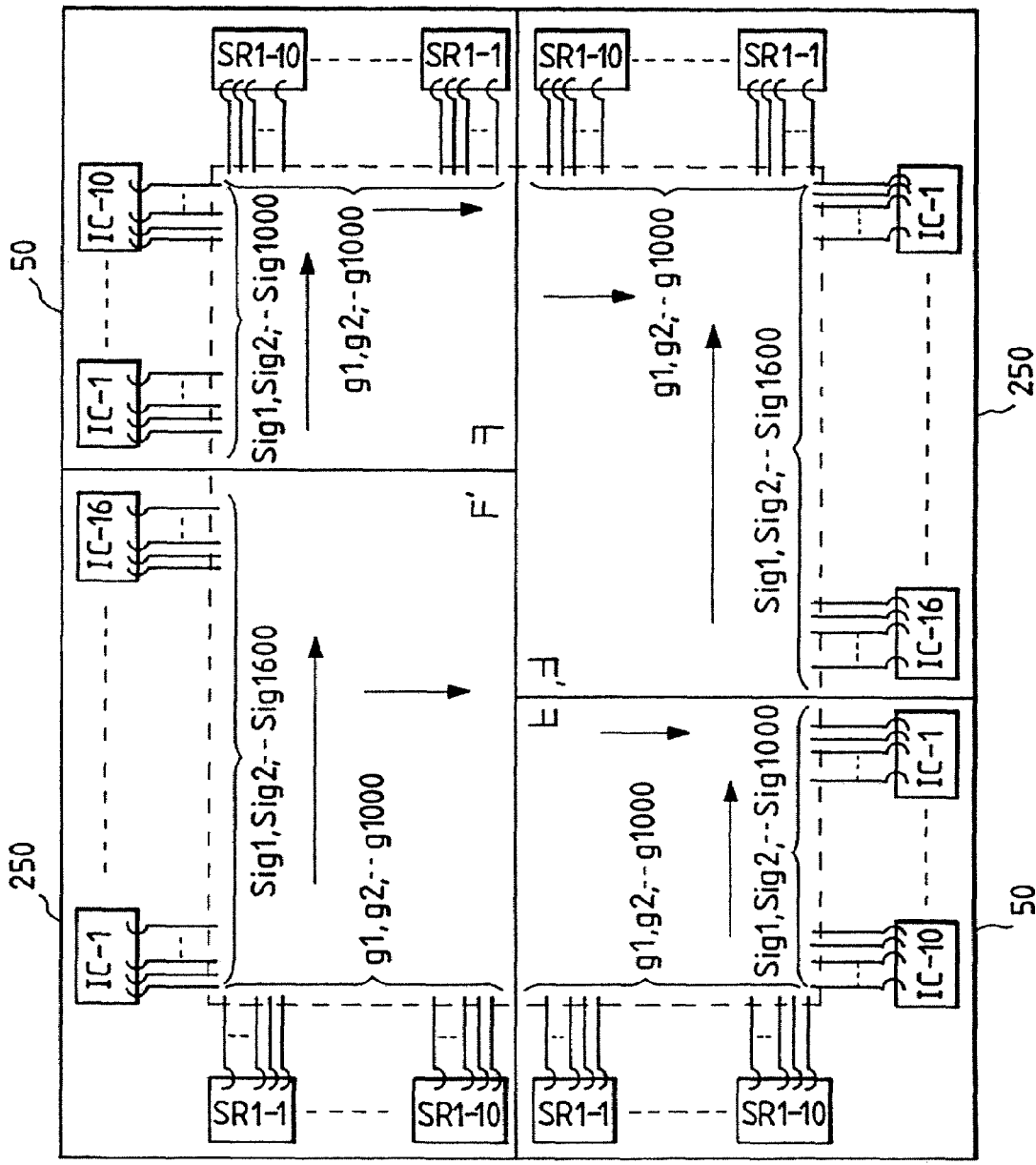
FIG. 9 is a plan view of a photoelectric converter according to a second embodiment of the present invention.

FIG. 9 is a plan view of a photoelectric converter according to a second embodiment of the present invention. The same reference numerals as are used in FIGS. 1 and 2 are also used in FIG. 3 to denote corresponding or identical components, and an explanation for them will be given only as needed.

The feature of the photoelectric converter shown in FIG. 9 is that the substrates in at least one pair of the four substrates have different shapes. In FIG. 9 is provided a photoelectric converter having large dimensions in which a plane of a photoelectric conversion portion results in a rectangular shape for which four substrates are bonded together. That is, a pair or devices on substrates 50 that are diagonally located relative to each other have the same structure, while a pair of devices on substrates 250 that are diagonally located relative to each other have the same structure. When a pair of substrates on a plane differ in shape, the photoelectric conversion portion of a photoelectric converter having large dimensions that is obtained by bonding four substrates in a plane together may be shaped like a square. Taking ease of fabrication and manufacturing costs into consideration, however, the device shown in FIG. 9 is more preferable.

When the photoelectric converter of the present invention having large dimensions of the present invention is employed for an X-ray machine for human breasts, the shape in a plane of the photoelectric conversion portion may be a rectangle, as in the second embodiment.

In this case, also, paired substrates are so formed that each of them has the same pattern, and that on each of them the same scan circuits and detection integrated circuits are mounted. The resultant two substrates are rotated 180° and are bonded together with as small a gap as possible between them, so as to constitute a photoelectric converter having large dimensions. As a result, the number of required components can be reduced. The inspection procedure can be performed by two types of devices, and the efficiency of the inspection procedure and the accompanying throughput can be increased. As a result, the cost of manufacturing a photoelectric converter having large dimensions can be reduced.

The scan circuits and the detection integrated circuits that are mounted on the four substrates can be driven bidirectionally, and circuits can be employed for which the shift directions are determined by the input of signals specifying the shift directions, so that the four substrates arranged in FIG. 3 can be scanned in the same direction. As a result, a simple circuit is possible for processing read signals for all of the photoelectric conversion devices, and signals can be processed at a high speed. Therefore, a photoelectric converter having large dimensions and high performance can be provided at a low manufacturing cost.

Third Embodiment

Figure 10:
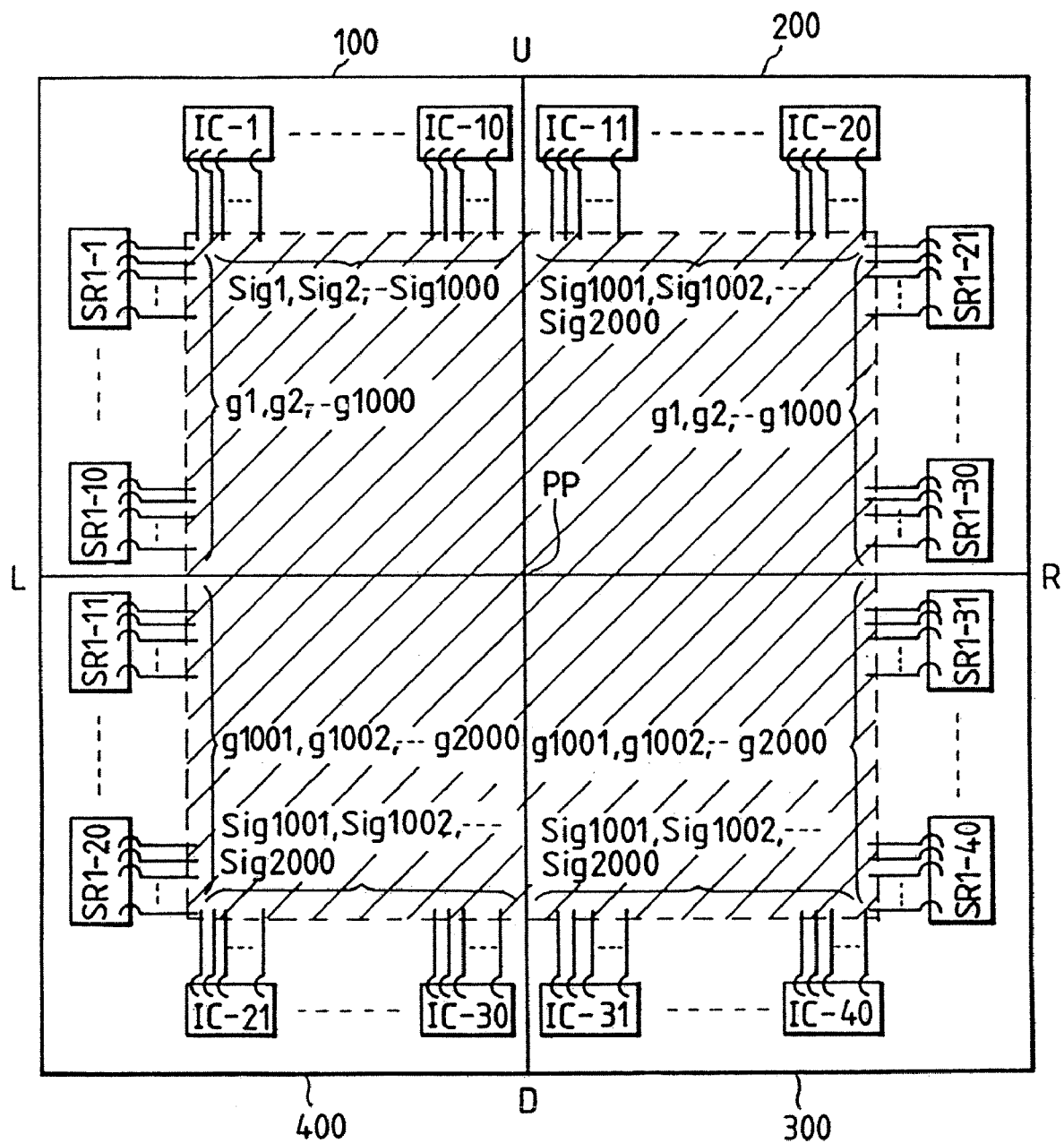
FIG. 10 is a plan view of the overall structure of a photoelectric converter according to a third embodiment of the present invention.

FIG. 10 is a plan view of the overall structure of a photoelectric converter according to a third embodiment of the present invention. The reference numerals employed are those used to denote corresponding or identical components in FIGS. 1 through 3, and no explanation will be given for them.

As the feature of the photoelectric converter shown in FIG. 10, photoelectric conversion device arrays (shaded portions enclosed by broken lines) that are mounted on substrates 100, 200, 300 and 400 are arranged closely adjacent to each other, and are bonded together to constitute a single large photoelectric converter having large dimensions.

Located on each substrate 100 are 1000×1000 photoelectric devices that are connected to 2000 lines, i.e., 1000 control lines g1 through g1000 and 1000 signal lines sig1 through sig1000. And as there are 100 scan circuits formed on a single IC chip, there are a total of 10 IC chips SR1 through SR1-10 located on the substrate 100 and are connected to the respective control lines g1 through g1000.

As for the integrated detection circuits, 100 processing circuits are integrated on a single IC chip, so that 10 IC chips, IC-1 through IC-10, are located on the substrate 100 and are connected to the signal lines sig1 through sig1000. The other substrates 200, 300 and 400 have the same structure as the substrate 100. Arranged on them are 1000×1000 photoelectric conversion devices that are connected to 1000 control lines and 1000 signal lines. Also provided are 10 of the scan circuits and 10 of the integrated detection circuits. Although these scan circuits and the integrated circuits may be same or may differ for each substrate, it is preferable that the above described ICs that can be driven bidirectionally be used for all the substrates. The four photoelectric conversion device arrays on the four substrates can be scanned at the same time. In this case, when compared with the example shown in FIG. 9, the time period for the scanning can be reduced to ¼ of that for the example shown in FIG. 9.

Figure 11:
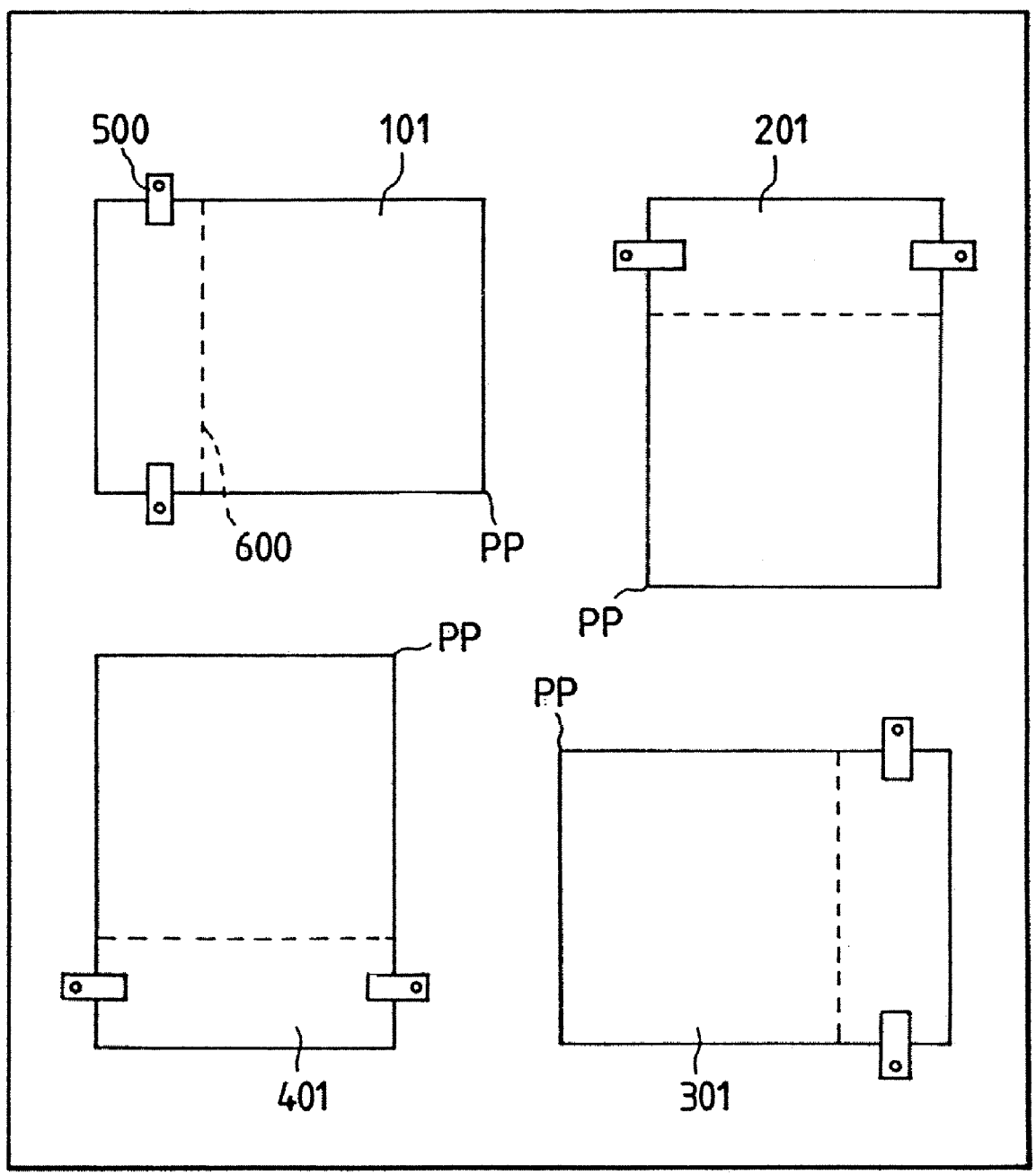
FIG. 11 is a diagram illustrating the arrangement of substrates in a plasma CVD device for fabricating a photoelectric converter according to the third embodiment of the present invention.

FIG. 11 is a diagram illustrating the arrangement of substrates in a plasma CVD device for fabricating a photoelectric converter according to the third embodiment of the present invention. The additional feature of the photoelectric converter in FIG. 10 is that the direction in which substrates 101, 201, 301 and 401, which respectively constitute the photoelectric converters 100, 200, 300 and 400 shown in FIG. 11, are arranged in the plasma CVD device is the same as the direction in which the photoelectric converters 100, 200, 300 and 400 are arranged. In other words, the substrates 101, 201, 301 and 401 are so arranged that their corners pp face the center.

In FIG. 11, tools 500 are employed to hold the substrates, and virtual cut lines 600 are employed along which the substrates are cut after thin film is deposited thereon.

Since generally a device for a parallel flat plate that ejects gas through holes in one of its electrodes is employed as a plasma CVD device, the film deposition speed tends to vary at the center of the substrates and at the center of the electrodes. On the other hand, an amorphous semiconductor layer, such as an amorphous silicon layer, is deposited on the four substrates as arranged shown in FIG. 11, and the substrates are bonded together in the illustrated direction. In the thus fabricated photoelectric converter having large dimensions, the characteristics of the photoelectric conversion devices at the seams of the four photoelectric converters are sequentially equalized, and as a result, a photoelectric converter that has large dimensions and has high performance can be provided.

As is shown in FIGS. 4 and 5, on each of the substrates are provided photoelectric conversion devices, each of which is a lamination of a first electrode layer 2, an insulating layer 7, a semiconductor layer 4, a semiconductor layer 5 for preventing introduction of a first conductive carrier, and a second electrode layer 6.

Fourth Embodiment

Figure 12:
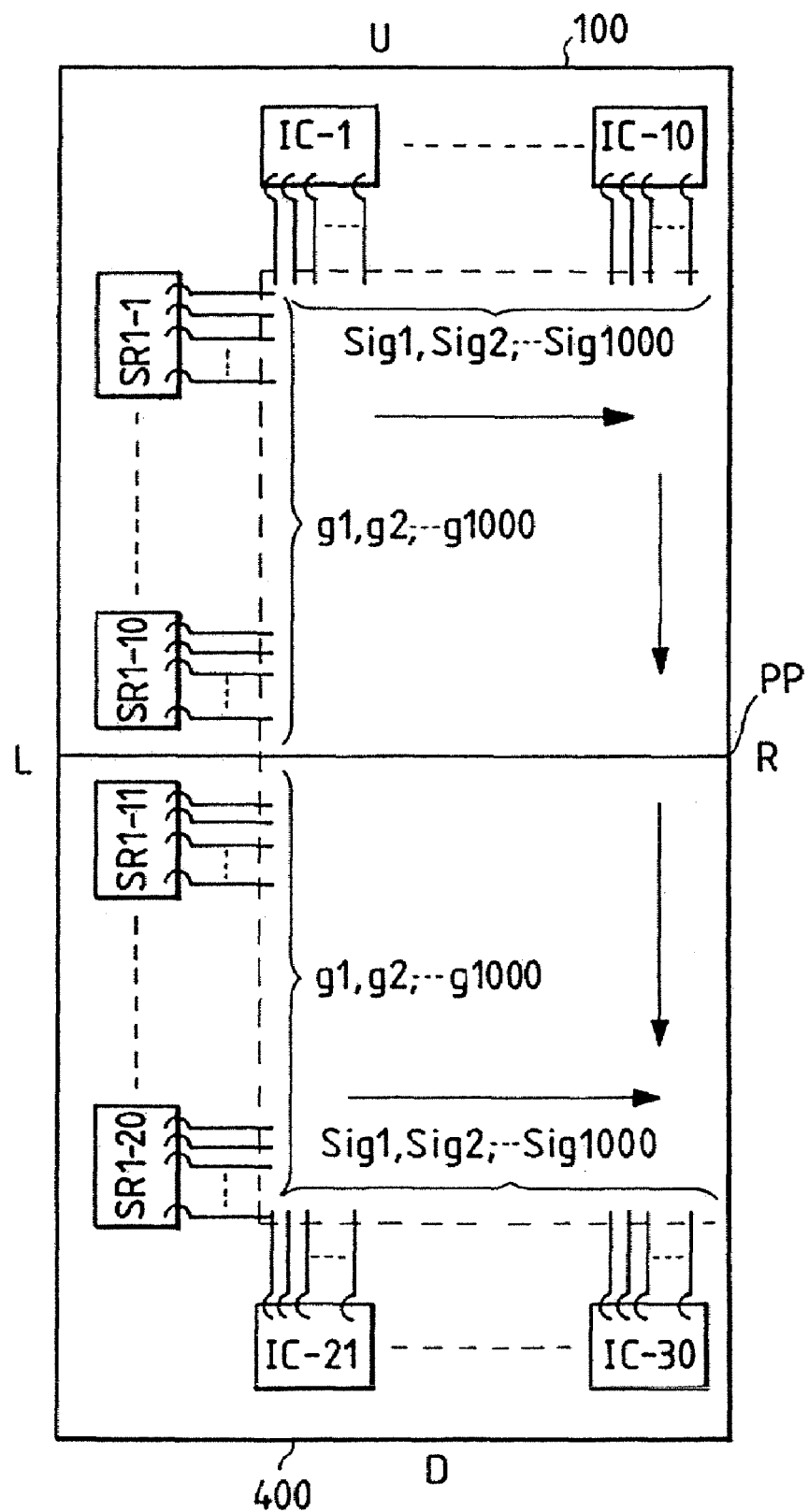
FIG. 12 is a plan view of a photoelectric converter according to a fourth embodiment of the present invention.

FIG. 12 is a plan view of a photoelectric converter according to a fourth embodiment of the present invention. The same reference numerals as are used in FIGS. 1 and 2 are also used in FIG. 3 to denote corresponding or identical components, and an explanation for them will be given only as needed.

The feature of the photoelectric converter shown in FIG. 12 is that photoelectric converters 100 and 400 are bonded together with as small a gap as possible between them to constitute a single, large photoelectric converter. As in the third embodiment, amorphous silicon is deposited on the photoelectric converters 100 and 400 that are arranged as is shown in FIG. 11 for the plasma CVD device. Thus, amorphous silicon is deposited on the substrates that are arranged as in FIG. 11. While maintaining this arrangement, the two substrates are bonded together as is shown in FIG. 12 so that the corners PP of the substrates 101 and 401 are aligned, and the photoelectric converter having large dimensions is thus fabricated. As a result, the characteristics of the photoelectric conversion devices at the seams of the two photoelectric converters become sequentially equal, and a photoelectric converter having large dimensions and a high performance can be produced.

Furthermore, as well as in the first through the third embodiments, since the scan circuits and detection integrated circuits that are mounted on the two substrates can be driven bidirectionally, the two photoelectric converters that are arranged as is shown in FIG. 12 can be scanned in the direction indicated by the arrows in FIG. 12.

Fifth Embodiment

According to a fifth embodiment, provided is an X-ray machine in which a fluoresent member is provided on the photoelectric conversion device in the first to the fourth embodiment.

Figure 13:
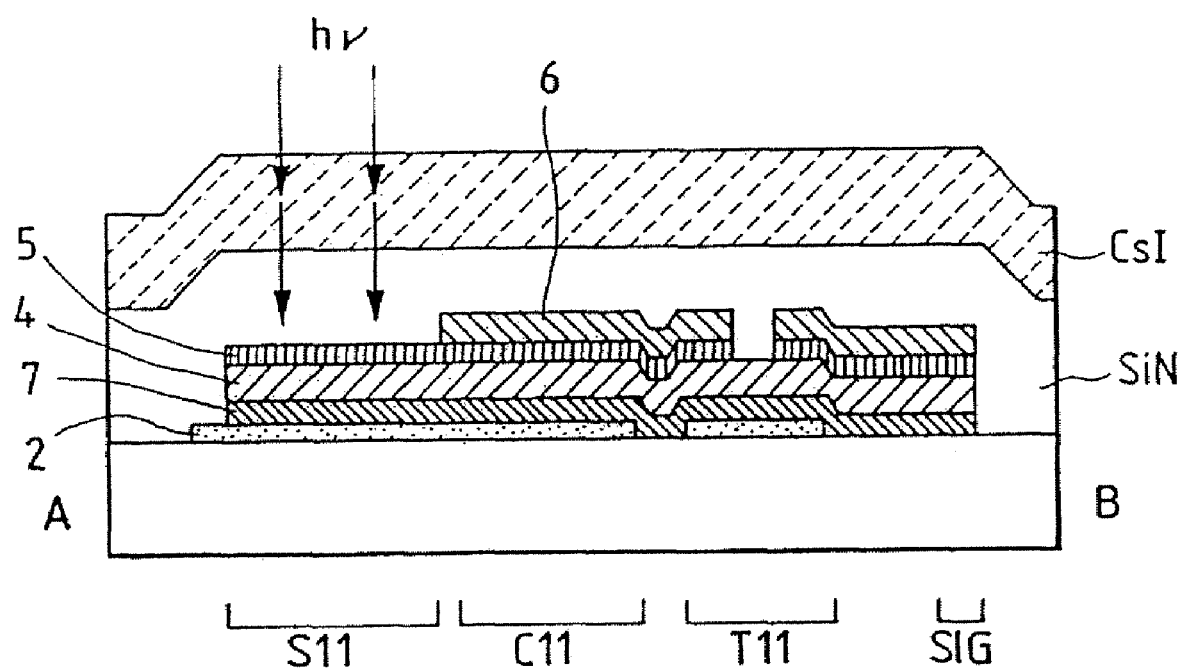
FIG. 13 is a cross sectional view of a structure according to a fifth embodiment of the present invention wherein a fluoresence member is provided on the photoelectric conversion device in the first to the fourth embodiment.

The basic structure on the substrate is one wherein a light emitting layer that absorbs a high energy beam and generates visual radiation is provided on the light entering side in FIG. 5. This structure is shown in FIG. 13. A fluoresent member is deposited as a light-emitting element on a passivated film SiN. The fluor may be composed of cesium iodide (CsI), and generate fluorescence when struck by an X-ray. The light-receiving device performs photoelectric conversion of the fluorescence. When 2000×2000 pixels are arranged two-dimensionally, with, for example, 5×5 pixels per 1-mm square, an X-ray detector of 40 cm×40 cm can be acquired.

A combination of this detector, which replaces an X-ray film, and an X-ray generator constitutes an X-ray machine that can be used for roentgen screening of breasts, or for examinations for mammary cancer. Unlike X-ray films, this X-ray detector can immediately display its output on a CRT, and the output can also be converted into digital output, for which image processing is performed by a computer, so that the output can be converted into an output that is consonant with the purpose of the device. The output data can be stored on a magneto-optical disk, and a quick search for previous images can be performed. The sensitivity of the detector is better than that of film, and a clear image can be provided by using an X-ray that has less adverse effect on a human body.

The method for driving a photoelectric conversion device array that is employed for the present invention will now be explained while referring to FIGS. 14 and 15. In this case, there are three scan lines for scan circuits on a single chip, while there are three data lines for the integrated detection circuits on a single chip, and a photoelectric conversion device array having a 3×3 matrix that can be driven is employed. When 10 scan circuit chips and 10 detection integrated circuit chips are employed, and when 1000 scan lines and 1000 data lines are provided and the photoelectric conversion device is a 1000×1000 matrix, it is apparent that scanning and detection for a single substrate in FIG. 3 can be performed.

Figure 14:
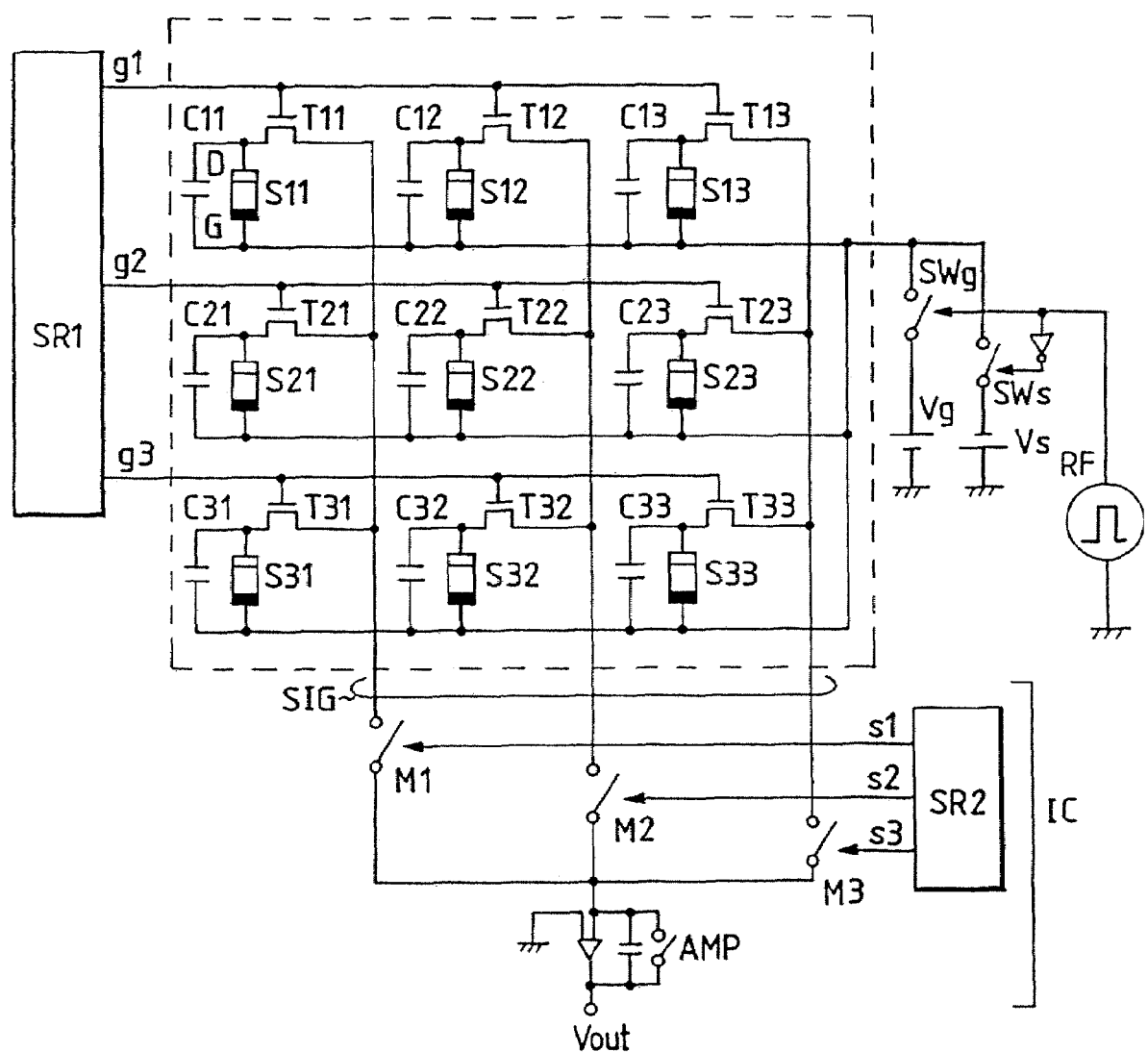
FIG. 14 is a circuit diagram for explaining a method for driving a photoelectric converter according to the present invention.

FIG. 14 is a circuit diagram for explaining a method for driving a photoelectric converter according to the present invention. The structure of individual photoelectric conversion devices (pixels) is the same as that shown in FIG. 4A, 4B, 5, or 13.

In FIG. 14, S11 through S33 denote light-receiving devices, each of which has a lower electrode G and an upper electrode D. Reference numerals C11 through C33 denote storage capacitors; and T11 through T33, transfer TFTs. A reading power source is denoted by Vs and a refresh power source is denoted by Vg. The power sources Vs and Vg are connected to the electrodes G of all the photoelectric conversion devices S11 through S33 via switches SWs and SWg. The switch SWs is connected to a refresh controller RF via an inverter, while the switch SWg is connected directly to the refresh controller RF. The refresh controller RF renders switch SWg on during a refresh period. One pixel is constituted by one light-receiving device, a capacitor and a TFT, and its output signal is transmitted to a detection integrated circuit IC across a signal line SIG.

The portion that is enclosed by broken lines in FIG. 14 is formed on the same insulating substrate having large dimensions.

Figure 15:
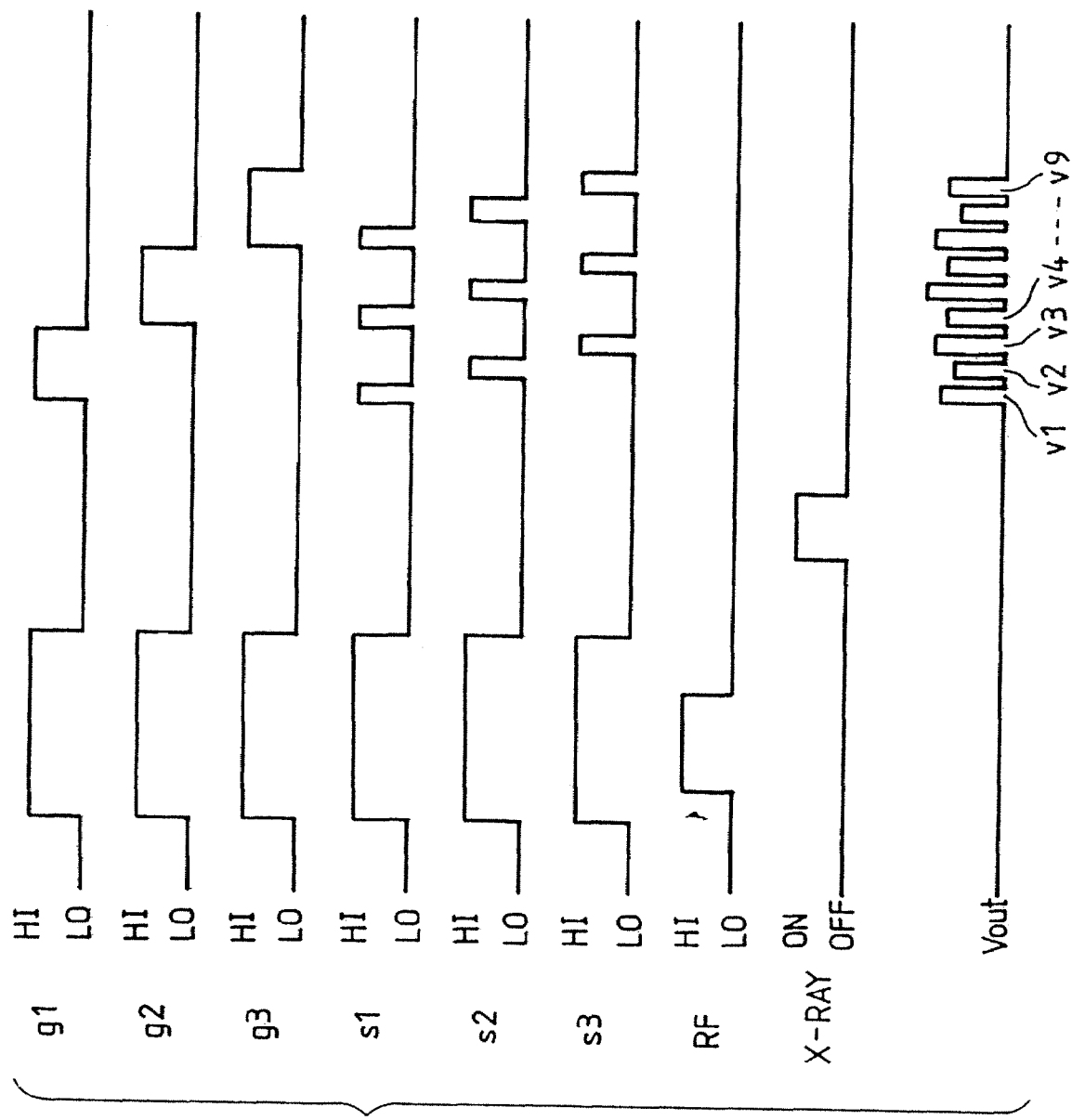
FIG. 15 is a timing chart showing the operation in FIG. 14.

FIG. 15 is a timing chart showing the operation in FIG. 14.

First, a high level pulse is applied to control lines g1 through g3 and s1 through s3 by the scan circuits SR1 and SR2. When the transfer TFTs T11 through T33, and switches M1 through M3 are rendered on and become conductive, and the electrodes D of all the light-receiving devices S11 through S33 acquire a GND potential as a reference potential because the input terminal of an integrating amplifier Amp is designed to be a GND potential. At the same time, when the refresh controller RF outputs a high level pulse and the SWg is turned on, the electrodes G of all the light-receiving devices S11 through S33 acquire a positive potential from the refresh power source Vg. Then, all of the light-receiving devices S11 through S33 are placed in the refresh mode and are refreshed. Sequentially, when the refresh controller RF outputs a low level pulse and SWs is turned on, the electrodes G of all the light-receiving devices S11 through S33 acquire a negative potential from the reading power source Vs. The light-receiving devices S11 through S33 are placed in a photoelectric conversion mode, and at the same time, the capacitors C11 through C33 are initialized. While the device is in this condition, a low level pulse is applied to the control lines g1 through g3 and s1 through s3 by the scan circuits SR1 and SR2. Then, the transfer TFTs T11 through T33 and the switches M1 through M3 are rendered off, and the electrodes D of all the light-receiving devices S11 through S33 are opened, but with their potentials being held by the capacitors C11 through C33.

Since no light beam is received at this time, no light is transmitted to the light-receiving devices S11 through S33 and a photocurrent does not flow across them. In this condition, a light beam pulse is emitted and is transmitted to the light-receiving devices S11 through S33 via an object to be exposed. An induced photocurrent that flows due to this light is stored as electric charges in the capacitors C11 through C33, and the electric charges are held therein after the transmission of a light beam has been completed.

Following this, a high level control pulse is applied to the control line g1 by the scan circuit SR1, and a control pulse is applied to the control lines s1 through s3 by the scan circuit SR2. Then, v1 through v3 are sequentially output via the switches M1 through M3 for the transfer TFTs T11 through T33. Similarly, the other light signals are sequentially output under the control of the scan circuits SR1 and SR2. Two-dimensional photo data are converted into electric signals v1 through v9. A static image is obtained by performing the above processing, while a moving image is obtained by repeating the above processing.

In this photoelectric converter, since the electrodes G of the light-receiving devices are connected in common, and the line that is used in common is connected to both the refresh power source Vg and the reading power source Vs via the switches SWg and SWs, respectively, to control the potentials of the electrodes G, all of the light-receiving devices can be switched to the refresh mode and to the photoelectric conversion mode at the same time. Therefore, light output can be obtained by using one TFT for each pixel and without requiring a complicated control system.

Instead of the X-ray film that is used in a conventional X-ray machine, a combination of the photoelectric converter of the present invention and an X-ray generator can constitute an innovative X-ray machine that can be used for roentgen screening of breasts and the examinations for mammary cancers. Unlike the X-ray film, the output can be immediately displayed on a CRT, and the output can also be converted into digital output, for which image processing is performed by a computer, so that the output can be converted into an output that is consonant with the purpose for which intended. The output data can be stored on a magneto-optical disk, and a search for previous images can be instituted without delay. The sensitivity provided is better than that for film, and a clear image can be provided by using an X-ray has less adverse effect on a human body.

A photoconductive device or a photovoltaic device is employed as the light-receiving device for the photoelectric converter of the present invention. For a reason that will be described later, however, the photoelectric conversion device shown in FIG. 4A, 4B, 5 or 13 is preferable.

Figure 16A:
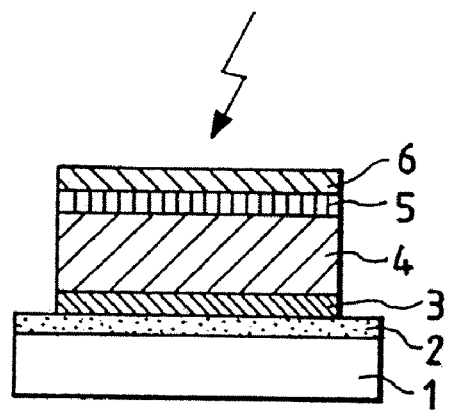
FIG. 16A is a diagram illustrating the structure of the layers of a PIN photosensor.
Figure 16B:
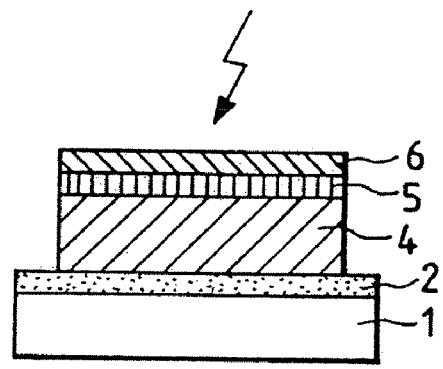
FIG. 16B is a diagram illustrating the structure of the layers of a Schottky photosensor.
Figure 16C:
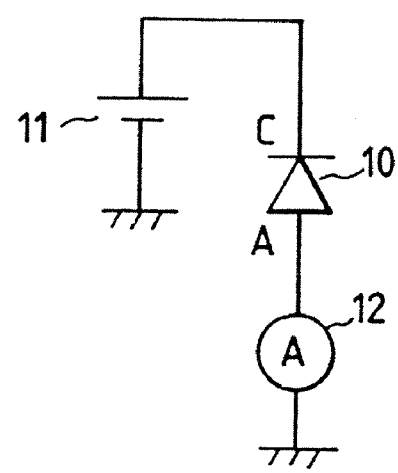
FIG. 16C is a diagram illustrating a typical commonly used driving system.

FIGS. 16A through 16C are diagrams illustrating the structure of a photosensor that servers as a light-receiving device. FIGS. 16A and 16B are diagrams illustrating the structure of the layers of two types of photosensors, and FIG. 16C is a diagram showing a typical, commonly used driving system. The photosensors in FIGS. 16A and 16B are photosensors of a photodiode type; the photosensor in FIG. 16A being called a PIN diode and the photosensor in FIG. 16B being called a Schottky diode.

In FIGS. 16A and 16B, reference numeral 1 denotes an insulating substrate; 2, a lower electrode; 3, a p semiconductor layer (hereinafter referred to as a p layer); 4, an intrinsic semiconductor layer (hereinafter referred to as an i layer); 5, an n semiconductor layer (hereinafter referred to as an n layer); and 6, a transparent electrode. In the Schottky diode in FIG. 16B, the material that is correct for the lower electrode 2 is selected, and a Schottky-barrier layer is formed so that electrons from the lower electrode 2 are not introduced into the i layer 4. In FIG. 16C, reference numeral 10 denotes the above described photosensor that is represented by using a symbol; 11, a power source; and 12, a detector, such as a current amplifier. At the photosensor 10, C denotes the transparent electrode 6 side in FIGS. 16A and 16B, and A denotes the lower electrode 2 side. The power source 11 is so set that when a positive voltage is applied at side A it is transmitted to side C.

The processing will now be briefly described. As is shown in FIGS. 16A and 16B, when light enters in the direction indicated by an arrow and reaches the i layer 4, the light is absorbed and electrons and hole carriers are generated. Since an electric field is applied to the i layer 4 by the power source 11, the electrons pass through the side C, i.e., the n layer 5, and move to the transparent electrode 6, while the hole carriers are shifted to the side A, i.e., to the lower electrode 2. As a result, a photocurrent flows across the photosensor 10. When no light enters, electrons and hole carriers are not generated in the i layer 4. The n layer 5 serves as a layer for preventing the introduction of hole carriers into the transparent electrode 6. In the PIN photosensor in FIG. 16A, the p layer 3 serves as a layer for preventing the introduction of electrons into the lower electrode 2, while in the Schottky photosensor in FIG. 16B, the Schottky-barrier layer serves as a layer for preventing the introduction of the electrons into the lower electrode 2. Therefore, the electrons and the hole carriers can not be moved and no current flows. Therefore, a current is varied depending on whether or not light enters. When this is detected by the detector 12 in FIG. 16C, the entire structure operates as a photosensor.

It is, however, difficult for the above described photosensor to be employed to produce a photoelectric converter having a high SN ratio and a low manufacturing cost. An explanation of the reasons will now be given.

The first reason is that the PIN photosensor in FIG. 16A and the Schottky photosensor in FIG. 16B require introduction prevention layers at two places. In the PIN photosensor in FIG. 16A, the n layer 5, which is an introduction prevention layer, must have such characteristics that when electrons are guided to the transparent electrode 6, that at the same time, hole carriers are prevented from being introduced into the i layer 4. If either characteristic is missing from the n layer 5, a photocurrent is reduced, or when light does not enter, a current (hereinafter referred to as a dark current) is generated and increases, which results in the deterioration of an SN ratio. The dark current is itself considered as noise, and also includes fluctuation called Schottky noise, i.e., so-called quantum noise. Even when a process for restricting a dark current is performed by the detector 12, quantum noise that accompanies the dark current can not be reduced. In order to improve the characteristics normally, generally the conditions for forming the i layer 4 and the n layer 5, and the annealing conditions after the photosensor is fabricated, must be optimized. The p layer 3, another introduction projection layer, requires the same characteristics, even though it prevents the introduction of electrons, not hole carriers, and the above described conditions for this layer must also be optimized. Normally, the conditions for optimization of the n layer and those for the p layer are not the same, and thus it is difficult to satisfy the conditions for both. In other words, it is difficult to fabricate a photosensor having a high SN ratio for which an introduction prevention layer is required at two places.

The same principle can be applied to the Schottky photosensor in FIG. 16B. Further, although for the Schottky type in FIG. 16B the Schottky-barrier layer is employed as one of the introduction prevention layers, a difference between the work functions of the lower electrode 2 and the i layer 4 is utilized. The material for the lower electrode 2 is limited, and the local level for an interface greatly affects its characteristics, so that it is more difficult to satisfy the above described condition. It is reported that a thin oxide film or a nitride film of silicon or metal of around 100 angstroms can be deposited between the lower electrode 2 and the i layer 4 in order to enhance the characteristics of the Schottky-barrier layer. According to this, hole carriers are guided to the lower electrode 2 by utilizing the tunnel effect, and the effect for the prevention of the introduction of electrons into the i layer 4 is improved. Since a difference in the work functions is also employed by this method, the material employed for the lower electrode 2 must be limited. Further, since opposite properties, i.e., the prevention of the introduction of electrons and the shifting of the hole carriers by using the tunnel effect, are employed, the oxide film or the nitride film that is formed must be very thin, around 100 angstroms, and as control of the thickness and the film quality is difficult, productivity is degraded.

Since the introduction prevention layer must be deposited at two places, productivity is degraded and manufacturing costs are increased. Since the characteristics of the introduction prevention layer are important, a photosensor wherein a defect occurs in even one of these layers can not provide the characteristics required for a photosensor.

Figure 17:
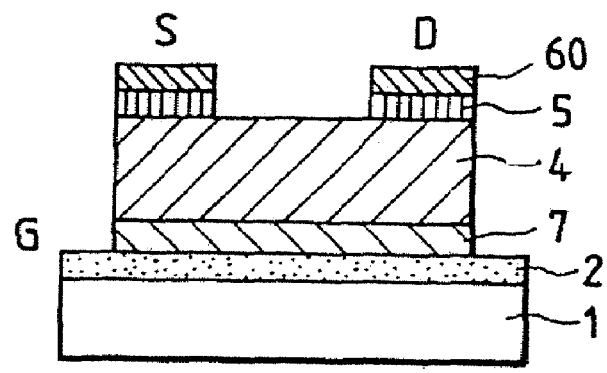
FIG. 17 is a diagram illustrating the layer structure of a field-effect transistor (TFT) that is constituted by a thin semiconductor film.

The second reason will now be described while referring to FIG. 17. FIG. 17 is a diagram illustrating the layered structure of a field-effect transistor (TFT) that is constituted by a thin semiconductor film. The TFT is sometimes used as a part of a control section in order to fabricate a photoelectric converter. The same reference numerals as are used in FIG. 16 are also used to denote corresponding or identical layers. In FIG. 17, reference numeral 7 denotes an insulating film and 60 denotes an upper electrode. The deposition method will be sequentially described. On an insulating substrate 1 are sequentially deposited a lower electrode 2 that serves as a gate electrode (G), a gate insulating film 7, an i layer 4, an n layer 5, and an upper electrode 60 that serves as a source electrode (S) and a drain electrode (D). Etching is performed on the upper electrode 60 to form the source electrode (S) and the drain electrode (D), and then etching is performed on the n layer 5 to form a channel portion. Since, as a characteristic of the TFT, it is sensitive to the condition of the interface between the gate insulating layer 7 and the i layer 4, generally, the above layers are sequentially formed in a vacuum to prevent contamination.

When a conventional photosensor is to be formed on the same substrate as the TFT, the above described layer structure becomes a problem, and results in an increase in manufacturing costs and in the degrading of the characteristics. This is because the structures of the photosensors in FIGS. 16A to 16C and of the TFT are different; the structure of the PIN photosensor in FIG. 16A is an electrode/p layer/i layer/n layer/electrode lamination, and the structure of the Schottky photosensor in FIG. 16B is an electrode/i layer/n layer/electrode lamination, while the structure of the TFT is an electrode/insulating film/i layer/n layer/electrode lamination. This means that the photosensor and the TFT can not be fabricated by the same process, and complicated processing results in a degradation of the yielding ratio and an increase in the manufacturing costs. The etching procedure for the gate insulating layer 7 and the p layer 3 is required in order to use the i layer/n layer in common. The p layer 3 and the i layer 4, which are the above described important introduction prevention layers for the photosensor, can not be deposited in the same vacuum, for the interface between the gate insulating film 7 and the i layer 4, which is important for the TFT, is contaminated when the gate insulating film is etched. As a result, the characteristics are deteriorated and the SN ratio is reduced.

In the Schottky photosensor in FIG. 16B, wherein an oxide film or a nitride film is formed between the lower electrode 2 and the i layer 4 to enhance its characteristics, although the order of film formation is the same as that shown in FIG. 17, the oxide film or the nitride film must be so formed that it is around 100 angstroms, as is described above, and it is difficult to employ that film as the gate insulating film.

Figure 18:
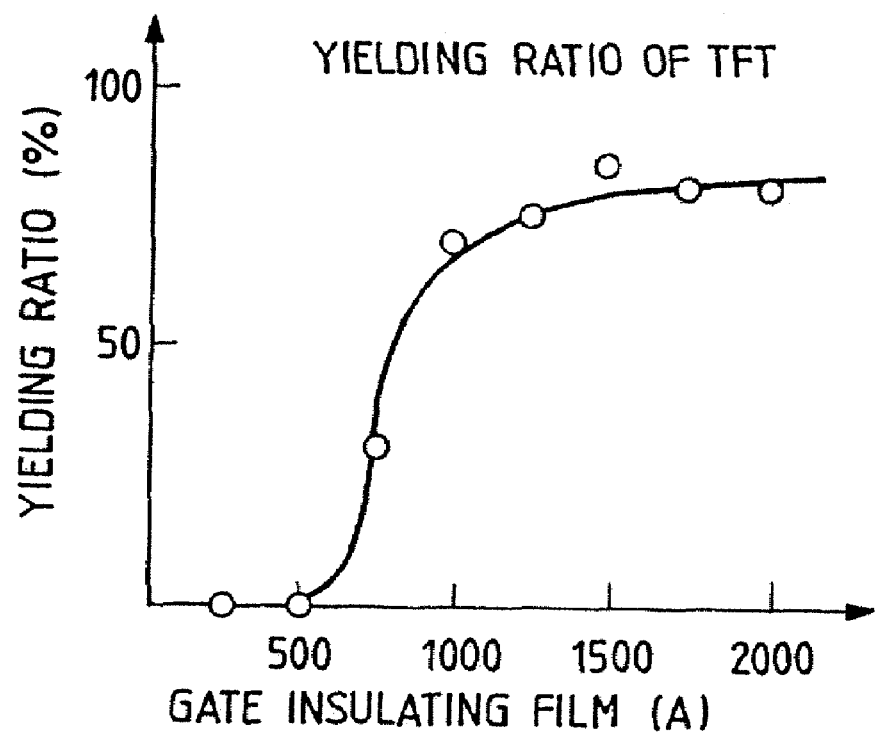
FIG. 18 is a graph showing our experimental results for an gate insulating film and a yielding ratio for the TFT.

FIG. 18 is a graph showing our experimental results for the gate insulating film and the yielding ratio for the TFT. With a gate insulating film of 1000 angstroms or less, the yielding ratio dropped drastically. With a gate insulating film of 800 angstroms, the yielding ratio was about 30%; with a film of 500 angstroms, the yielding ratio was 0%; and with a film of 250 angstroms, it was not even possible to confirm the operation of the TFT. As is apparent from the data, it is difficult to use an oxide film or a nitride film of a photosensor that employs the tunnel effect as the gate insulating film for a TFT that must insulate electrons and hole carriers.

Further, though not shown, it is difficult for a capacity device (hereafter referred to as a capacitor), which is a device that is required for obtaining the integral values of electric charges or of a current, to be fabricated so that it has the same structure as that of the photosensor, and so that it has a preferable characteristic for reducing leakage. Since the capacitor stores electric charges between two electrodes, a layer for preventing the movement of electrons and hole carriers must be formed as an intermediate layer between the electrodes. However, since the conventional photosensor uses only a semiconductor layer between the electrodes, it is difficult to obtain an intermediate layer that has a preferable characteristic for thermally reducing leakage.

As is described above, the processing and the characteristics of the TFT and the capacitor, which are important devices for a photoelectric converter, do not correspond with each other. Because of this problem, procedures are increased and are made more complicated for the fabrication of a system wherein a plurality of photosensors are two-dimensionally arranged and light signals are sequentially detected. This results in a deterioration of the yielding ratio, and prevents the production of a device having a low manufacturing cost and high performance and multiple functions.

On the other hand, the above shortcoming can be resolved by using the photoelectric device previously described while referring to FIGS. 4A, 4B, 5, 13, 14 and 15.

In the above described embodiment shown in FIG. 3, the photoelectric converter can be so driven that only for the photoelectric conversion device array on the upper right hand substrate 150, scanning and detection is performed, with no scanning and detection being performed for the other three substrates.

However, in the device array on the upper right hand substrate 150, signal detection can not be performed only for devices that are located at the intersections of the 100 control lines, g1, g2, . . . , and g100, and the 100 signal lines sig1, sig2, . . . , and sig100. When only signals for the devices at the intersections are to be reproduced, signals are read from all the devices on the upper right hand substrate 150, and then only the required signals are reproduced.

In a photoelectric converter in the following embodiment, scan circuit chips and detection chips include a decoder, and a control line and a signal line to be selected are determined based on address data received from a controller, with only a terminal that is connected to these selected lines being selected.

Figure 19:
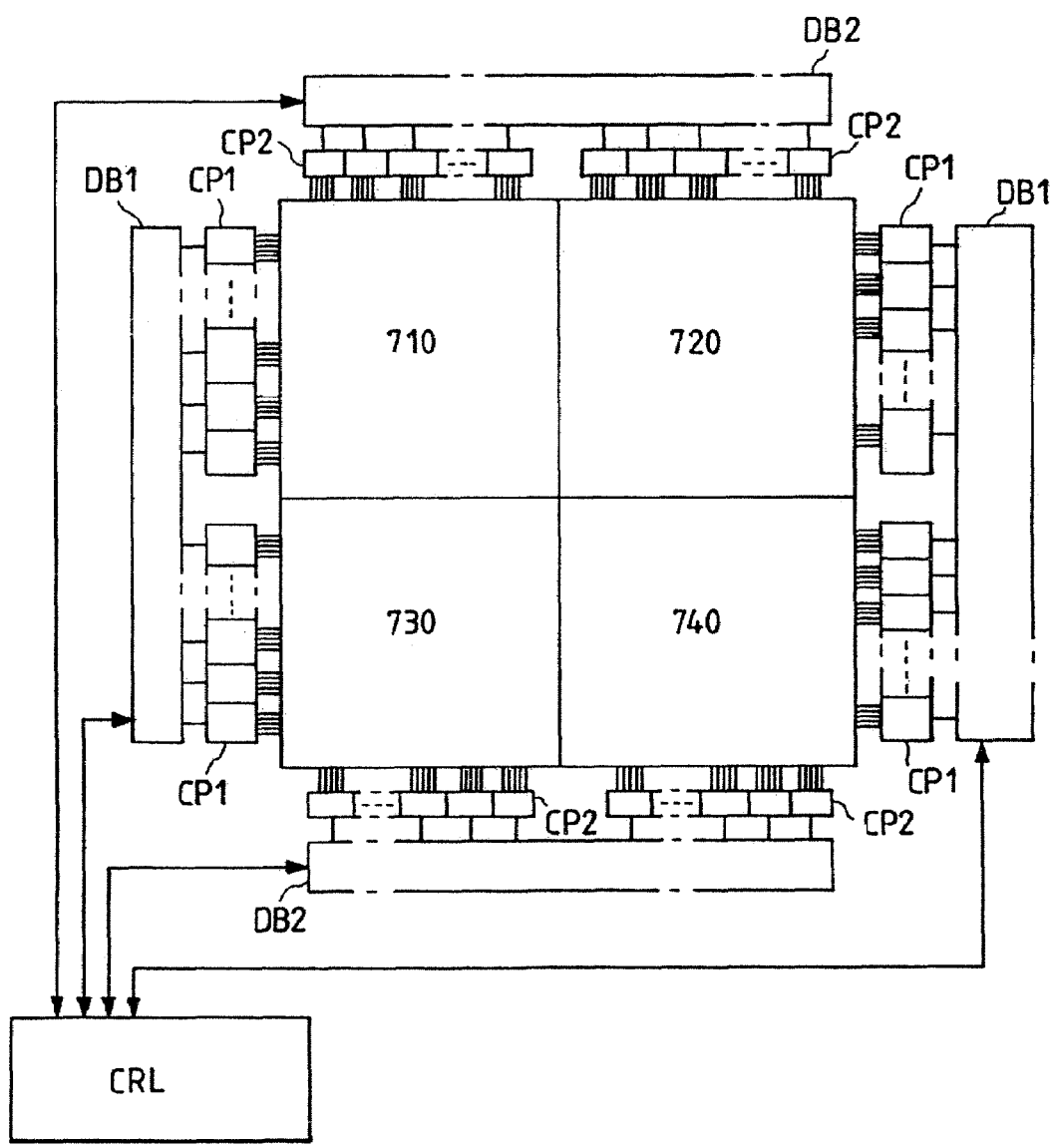
FIG. 19 is a diagram illustrating photoelectric conversion device arrays that are mounted on four substrates.

In FIG. 19, a photoelectric conversion device array is mounted on four substrates 710, 720, 730 and 740. Control lines are connected to 10 scan selector chips CP1, which are provided on each of the right and the left hand sides, and signal lines are connected to 10 detection IC chips CP2, which are provided on each of the upper and the down sides.

A controller CRL selectively supplies, via wiring circuits DB1 and DB2, address data for a photoelectric device, which is to be selected for scanning, to chips CP1 and CP2 that have terminals which correspond to the address data. Upon the receipt of the address data, the chips CP1 or CP2 decode the data and enable the terminals that are to be selected. In this manner, a masking process is easily performed wherein only signals from a photoelectric conversion device that is located in a required region are reproduced.

As is described above, since each chip has a decoder, the scan selector chips having the same structure can be located on either the right or the left hand side. This can be applied for the IC detection chips.

Further, since the decoder is included, a plurality of control lines can be selected at the same time, or the chips can be selected for scanning by skipping a predetermined number of lines. This can be applied for the IC detection chips.

For example, while a group of 5×5 adjacent photoelectric conversion devices are regarded as one unit, a 40 cm×40 cm array that is constituted by 2000×2000 photoelectric conversion devices is treated as a 400×400 array of 1 mm×1 mm unit pixels (5×5 photoelectric conversion device group). Signals can be detected by sequentially scanning these unit pixels.

In this case, the output signal of the unit pixels is an averaged value for 5×5 photoelectric conversion devices.

As is described above, according to the present invention, it is possible during the fabrication process to reduce the manufacturing cost of a photoelectric converter having large dimensions by increasing a yielding ratio for each substrate, and by reducing losses due to defects on each substrate.

Further, according to the present invention, it is possible to improve the throughput by providing improved efficiency on an inspection procedure that is performed during the fabrication of a photoelectric converter having large dimensions, and to reduce the total manufacturing cost by reducing the number of components.

In addition, according to the present invention, it is possible to enhance the function of a photoelectric converter having large dimensions by scanning all of the photoelectric conversion devices in the same direction and by simplifying the signal processing.

What is claimed is:

1. A photoelectric converter comprising:
   a scan circuit for scanning an array of photoelectric conversion devices arranged two-dimensionally; and
   a detection circuit for detecting a signal outputted from said array of photoelectric conversion devices,
   wherein said scan circuit comprises a plurality of IC chips capable of scanning bi-directionally having the same circuit structure respectively, and disposed on opposing two sides of said array of photoelectric conversion devices arranged two-dimensionally, and a scanning direction for IC chips disposed on opposing two sides of the array of photoelectronic conversion devices is determined according to one or more common input signals inputted into each IC chip, and
   wherein each IC chip receives as an input, one of said one or more common input signals that determine the scanning direction.

2. A photoelectric converter according to claim 1, wherein each said IC chip is mounted on a flexible wiring substrate.

3. A photoelectric converter according to claim 1, wherein each said IC chip is mounted on said substrate or on a mother board supporting said substrate.

4. A photoelectric converter according to claim 1, wherein the scanning directions for IC chips disposed on opposed two sides of said array of photoelectronic conversion devices are set to be the same according to a shift direction of a shift register.

5. A photoelectric converter according to claim 1, wherein the scanning directions for the IC chips disposed on opposing two sides are of said array of photoelectronic conversion devices are set to be the same according to a switching order of a multiplexer.

6. A photoelectric converter according to claim 1, wherein on said plurality of photoelectric conversion devices, a photoelectric conversion substance is disposed.

7. A photoelectric converter according to claim 1, wherein on said plurality of photoelectric conversion devices, a phosphor is disposed.

8. A photoelectric converter according to claim 1,
   wherein each of said photoelectric conversion devices is formed by laminating a first electrode layer, an insulating layer, an intrinsic semiconductor layer, an injection blocking semiconductor layer for blocking injection of carriers of a first conductivity type, and a second electrode layer.

9. A photoelectric converter according to claim 8, wherein said intrinsic semiconductor layer of said photoelectric conversion device is a non-monocrystalline semiconductor layer.

10. An X-ray image pick-up device comprising:
    a scan circuit for scanning a conversion device array receiving an X-ray image and generating an electric signal corresponding to the X-ray image; and
    a detection circuit for detecting the signal outputted from said conversion device array,
    wherein said scan circuit comprises a plurality of IC chips capable of scanning bi-directionally having the same circuit structure respectively, and disposed on opposing two sides of said array of photoelectric conversion devices arranged two-dimensionally, and a scanning direction for IC chips disposed on opposing two sides of the array of photoelectronic conversion devices is determined according to one or more common input signals inputted into each IC chip, and
    wherein each IC chip receives as an input, one of said one or more common input signals that determine the scanning direction.

11. An X-ray image pick-up device according to claim 10, wherein each said IC chip is mounted on a flexible wiring substrate.

12. An X-ray image pick-up device according to claim 10, wherein each said IC chip is mounted on a substrate or on a mother board supporting said substrate.

13. An X-ray image pick-up device according to claim 10, wherein the scanning directions for IC chips disposed on opposing the two sides of said conversion device array are set to be the same according to a shift direction of a shift register.

14. An X-ray image pick-up device according to claim 10, wherein the scanning directions for IC chips disposed on opposing the two sides of said conversion device array are set to be the same according to a switching order of a multiplexer.

15. An X-ray image pick-up device according to claim 10, wherein said conversion device array has a plurality of photoelectric conversion devices and a photoelectric conversion substance disposed on said photoelectric conversion devices.

16. An X-ray image pick-up device according to claim 10, wherein said conversion device array has a plurality of photoelectric conversion devices and a phosphor disposed on said photoelectric conversion device.

17. An X-ray image pick-up device according to claim 10, wherein said scan circuit is connected to a gate of a thin film transistor.

18. An X-ray image pick-up device according to claim 17, wherein a semiconductor layer of said thin film transistor is a non-monocrystalline semiconductor layer.

19. A photoelectric converter according to claim 1, wherein said detection circuit comprises a plurality of IC chips capable of scanning bi-directionally having the same structure respectively, and disposed on opposing two sides of said conversion device array, and a driving direction for IC chips disposed on opposing two sides of said conversion device array is determined according to one or more common input signals inputted into each IC chip, and wherein each IC chip receives as input, one of said one or more common input signals that determine the driving direction.

20. An X-ray image pick-up device according to claim 10, wherein said detection circuit comprises a plurality of IC chips capable of scanning bi-directionally having the same structure respectively, and disposed on opposing two sides of said conversion device array, and a driving direction for IC chips disposed on opposing two sides of said conversion device array is determined according to one or more common input signals inputted into each IC chip, and wherein each IC chip receives as input, one of said one or more common input signals that determine the driving direction.

* * * * *

UNITED STATES PATENT AND TRADEMARK OFFICE
CERTIFICATE OF CORRECTION

PATENT NO. : 7,285,765 B2
APPLICATION NO. : 11/622971
DATED : October 23, 2007
INVENTOR(S) : Isao Kobayashi et al.

It is certified that error appears in the above-identified patent and that said Letters Patent is hereby corrected as shown below:

COLUMN 2:

Line 35, "liens" should read --lines--.

COLUMN 3:

Line 16, "second" should read --first--;
Line 22, "third" should read --second--; and
Line 27, "fourth" should read --third--.

COLUMN 5:

Line 17, "an" should read --a--; and
Line 65, "structured" should read --structure--.

COLUMN 6:

Line 13, "a small" should read --small a--.

COLUMN 7:

Line 29, "capacitor C12" should read --capacitor C11--; and
Line 67, "and-an" should read --and an--.

COLUMN 9:

Line 30, "or devices" should read --of devices--.

COLUMN 13:

Line 52, "has" should read --having--; and
Line 60, "severs" should read --serves--.

UNITED STATES PATENT AND TRADEMARK OFFICE
CERTIFICATE OF CORRECTION

PATENT NO.        : 7,285,765 B2
APPLICATION NO.   : 11/622971
DATED             : October 23, 2007
INVENTOR(S)       : Isao Kobayashi et al.

It is certified that error appears in the above-identified patent and that said Letters Patent is hereby corrected as shown below:

COLUMN 15:

Line 39, "sometime" should read --sometimes--.

Signed and Sealed this

Thirtieth Day of September, 2008

JON W. DUDAS
*Director of the United States Patent and Trademark Office*